(12) United States Patent
Belagali

(10) Patent No.: US 11,281,436 B2
(45) Date of Patent: Mar. 22, 2022

(54) SYSTEM FOR CREATING ONE OR MORE DEPLOYABLE APPLICATIONS AND SOURCE CODE THEREOF USING REUSABLE COMPONENTS AND METHOD THEREFOR

(71) Applicant: Ashish Belagali, Pune (IN)

(72) Inventor: Ashish Belagali, Pune (IN)

( * ) Notice: Subject to any disclaimer, the term of this patent is extended or adjusted under 35 U.S.C. 154(b) by 54 days.

(21) Appl. No.: 16/627,355

(22) PCT Filed: Jun. 29, 2018

(86) PCT No.: PCT/IN2018/050428
§ 371 (c)(1),
(2) Date: Dec. 30, 2019

(87) PCT Pub. No.: WO2019/003252
PCT Pub. Date: Jan. 3, 2019

(65) Prior Publication Data
US 2020/0125345 A1    Apr. 23, 2020

(30) Foreign Application Priority Data
Jun. 30, 2017  (IN) .............................. 201721023071

(51) Int. Cl.
*G06F 9/445*   (2018.01)
*G06F 8/34*    (2018.01)
(Continued)

(52) U.S. Cl.
CPC ................. *G06F 8/34* (2013.01); *G06F 8/20* (2013.01); *G06F 8/36* (2013.01); *G06F 8/60* (2013.01);
(Continued)

(58) Field of Classification Search
CPC .. G06F 21/6218; G06F 16/20; G06F 11/3636; G06F 11/3672; G06F 11/3688;
(Continued)

(56) References Cited

U.S. PATENT DOCUMENTS 6,856,950 B1 * 2/2005 Abts ...................... G06F 30/33
                                                         703/13
7,406,483 B2    7/2008 Leymann et al.
(Continued)

OTHER PUBLICATIONS

International Search Report of PCT Patent Application No. PCT/IN2018/050428 dated Oct. 16, 2018.

*Primary Examiner* — Tuan A Vu

(57) ABSTRACT

Disclosed are a system (100) and a method for creating a one or more deployable applications and a source code thereof using reusable components. The system (100) comprises of a repository (20), a flow/project (30), namespaces, a developer's workbench (40), an assembler's workbench (50) and a monitoring workbench (60). The repository includes reusable components. The flow/project (30) consists of component connectivity information comprising control flow and data flow. The repositories and projects are contained within one or more namespaces. The method involves creating component definition in one or more repositories (20), generating code stubs based on a supported technology for corresponding architecture layer and burning the flow, the component definition and implementations to form the deployable application. Further, a monitoring step involves supporting run time debugging. The method provides components within repository that are independent of one another.

19 Claims, 9 Drawing Sheets

(51) Int. Cl.
*G06F 8/20* (2018.01)
*G06F 8/36* (2018.01)
*G06F 8/60* (2018.01)
*G06F 30/20* (2020.01)
*G06F 11/36* (2006.01)
*G06F 9/48* (2006.01)
*G06Q 30/02* (2012.01)
*G06F 30/33* (2020.01)
*G06Q 10/06* (2012.01)
*H04L 67/564* (2022.01)

(52) U.S. Cl.
CPC .......... *G06F 9/4812* (2013.01); *G06F 11/368* (2013.01); *G06F 30/20* (2020.01); *G06Q 30/02* (2013.01); *G06F 30/33* (2020.01); *G06Q 10/0633* (2013.01); *H04L 67/2819* (2013.01)

(58) Field of Classification Search
CPC ...... G06F 11/3684; G06F 8/41; G06F 9/4812; G06F 8/60; G06F 8/34; G06F 8/36; G06F 30/20; G06F 30/33; G06F 11/368; H04L 41/5032; H04L 47/70; H04L 67/2819; G01R 31/318536; G06Q 10/0633; G06Q 30/02
See application file for complete search history.

(56) References Cited

U.S. PATENT DOCUMENTS

| | | | |
|---|---|---|---|
| 7,627,671 B1 | 12/2009 | Palma et al. | |
| 8,387,020 B1* | 2/2013 | MacLachlan | G06F 11/3672 717/126 |
| 9,286,329 B2 | 3/2016 | Svarovsky et al. | |
| 10,521,197 B1* | 12/2019 | Ciolfi | G06F 30/20 |
| 2003/0097650 A1* | 5/2003 | Bahrs | G06F 11/3688 717/124 |
| 2003/0135850 A1* | 7/2003 | Miloushev | G06F 9/4812 717/165 |
| 2003/0145286 A1* | 7/2003 | Pajak | G01R 31/318536 716/106 |
| 2004/0044986 A1* | 3/2004 | Kompalli | G06Q 30/02 717/100 |
| 2004/0054690 A1* | 3/2004 | Hillerbrand | H04L 67/2819 |
| 2005/0071243 A1* | 3/2005 | Somasekaran | G06F 11/3636 705/26.1 |
| 2007/0021995 A1* | 1/2007 | Toklu | G06Q 10/0633 705/7.27 |
| 2010/0157822 A1* | 6/2010 | Ivanov | H04L 41/5032 370/252 |
| 2010/0318492 A1* | 12/2010 | Utsugi | G06F 16/20 707/603 |
| 2010/0332535 A1* | 12/2010 | Weizman | G06F 11/3672 707/770 |
| 2012/0159577 A1* | 6/2012 | Belinkiy | G06F 21/6218 726/4 |
| 2013/0139164 A1* | 5/2013 | Balko | G06F 8/41 718/102 |
| 2014/0189653 A1* | 7/2014 | Larson | G06F 11/368 717/125 |
| 2015/0052500 A1* | 2/2015 | Herron | G06F 11/3684 717/124 |
| 2016/0147570 A1* | 5/2016 | Darji | H04L 47/70 718/104 |
| 2017/0249130 A1* | 8/2017 | Smiljanic | G06F 8/43 |

\* cited by examiner

SYSTEM FOR CREATING ONE OR MORE DEPLOYABLE APPLICATIONS AND SOURCE CODE THEREOF USING REUSABLE COMPONENTS AND METHOD THEREFOR

CROSS-REFERENCE TO RELATED APPLICATIONS AND PRIORITY

The present application is National Phase Application corresponding to PCT Application PCT/IN2018/050428 filed on the 29 Jun. 2018 which further claims priority from Indian patent application no. 201721023071 filed on the 30 Jun. 2017, the details of both are incorporated herein by a reference.

FIELD OF THE INVENTION

The present invention relates to a system and method for creating one or more of deployable application and source code thereof using reusable components.

BACKGROUND OF THE INVENTION

Isolating complex design into manageable components is a goal of component technologies (or modular technologies). The component technologies and visual modeling are not new. They are at least a few decades old. The prior art of isolating complex design into manageable components can be classified into following 5 categories:

1. UML/CASE Tools:

UML (Unified Modeling Language) aims to serve two different roles i.e. a communication protocol between human beings and a hard design specification. There are tools to use UML class diagrams to generate classes and method stubs (forward engineering), and also do the reverse engineering from existing classes to generate class diagrams.

The forward engineering achieves a desirable separation of design and coding activities, as the design is graphical and can be done largely without getting into programming language semantics. FIG. 1 shows the flow of this process. As shown in it, the code generation results in a single codebase for the entire application, which then gets modified by the developers during the development phase. The skeleton code that is generated is expected to be modified by the developers. As the development proceeds, the initial design can be, and in almost every case is, compromised. As a result, the UML diagrams and the code bifurcate within a few months. The biggest drawback of this approach is that there is nothing that prevents this from happening.

In case of reverse engineering, the reverse engineered class diagrams are usually so complex that they are hardly useful for human understanding.

2. High Level Business Processes:

There is a broad category of visual tools where high level blocks of pre-defined functionality are visually arranged to define the flow. For example, the business process modeling (BPM) tools are used in the automation of business process, and let the users arrange blocks of business process visually. As another example, ETL (Extract/Transform/Load) tools are used for data processing. They allow the users to work visually with blocks of pre-defined operations. These blocks are configurable to suit the characteristic of the data at hand. As yet another example, Visual DevOps tools are used in continuous integration to visually organize and configure the various building blocks in the Continuous Integration.

The workflow is as shown in FIG. 2, and one may notice that there is no explicit code generation step. The flow is defined with the tool and tool uses the flow information at run time to guide the execution along the defined flow. The blocks are usually pre-defined, so there is little or no programming involved. The blocks are always defined at a macro level, as there would be significant performance penalties with this approach when the number of blocks grows substantially, or the number of transitions between these blocks grows.

3. Visual Programming Tools:

Flowcharting tools or tools such as Node-RED allow visual definition of the flow and then coding individual components. The code is associated with a component throughout the life of software. So, the application stays modular and the visual graph represents the actual flow in the software. In theory, the components may be visually rearranged to redefine the application flow.

However, while the control flow is taken care of, the data flow is not captured in the visual graph. Therefore, a rearrangement of the components does not work out of the box in practice and necessitates a programmer's intervention to make sure that the data is correctly initialized before it gets used, and to make changes to the components to fix any issues that happen because of it. Thus, the reusability of the components and the configurability of the flow are limited in this approach.

4. Non-Visual RAD Frameworks:

There are plenty of frameworks intended to be used for rapid application development but they do not provide an inbuilt visual representation. Many of them help to keep the application modular. Examples of such technologies start from the most basic functions and subroutines, then objects and classes, and further as static and dynamically linked libraries; and finally as services exposed as API that represent code deployed remotely. For decades, these have helped the programmers in two aspects. One is that the programming teams can work independently in development of different components, which means that development of different components can happen in parallel. Secondly, as plenty of reusable components and services are available, the programmers can just reuse those in their programs. This saves substantial time, need for expertise and cost, as opposed to a situation where such components/services were not available and the programmers had to develop everything from scratch.

The limitation of this approach is that this approach caters only to the programmers and difficult to be used by the non-programmers because of the lack of visualization of the program flow. For anyone who cannot or does not want to get into the code, the code design is opaque. Even for the people who have the ability to understand the program code, going through the program code to understand the code design is a complex and error-prone activity. Today's codebases are so large and complex that understanding the code base is further challenging. This is the reason that team changes hurt a software development project during development. Further, during its maintenance phase over the long life where the team changes are inevitable, the maintenance cost and risk go higher and higher. Most software applications are so complex that reverse engineered diagrams are highly complicated and are practically useless for human understanding.

5. Decomposition Into Smaller Deployables:

Decomposing a software application into a number of deployables instead of one large deployable is a trend that has picked up attention. The slicing may happen horizontally—as layers of the application—or vertically—as microservices that cater to different functionalities. As the deployables are separate, the contracts between them are clearly laid out and the teams can work on them independently, even at the same time. While this is clearly a step in the right direction, it is implicitly understood that decomposition is at a macro level. If one extended this approach to create hundreds of layers or hundreds of microservices, then the overheads of communication among the various deployables would be too high to make it practical.

Limitations of the Prior Art:

The code quality and enhanceability are directly linked to modularity of the code. However, maintaining the modularity throughout the life of the software is a big challenge. The teams change and the code gets handled by different people at different times. The skills of different team members are not equal, and therefore sooner or later the modularity is compromised and the code starts degenerating into a spaghetti structure. Many legacy software tools which were developed a few years ago stand testimony to the fact that the original design principles are compromised and the maintainability and enhanceability are therefore low. With time, it becomes more and more challenging to understand the code for maintaining/enhancing. The risk of code changes affecting some other functionality unintentionally increases with time.

Another reason for the maintainability and enhanceability to go low is that there are unnecessary variables which stay in the code. The unnecessary variables get inserted during code enhancements to keep the legacy code intact. For the same reason, inefficient control structures are found in the legacy code. The control structures get more and more complex and difficult to diagnose or remove as different developers work on it. The unnecessary variables and inefficient control structures also mean consumption of higher memory than necessary and a waste of processing cycles.

Visual representation of the code structure is a good solution for understanding and enhancing the code. However, in practice, the visual design does not keep pace with the code changes. This is because they need to be done separately alongside the code changes and it takes a very strict discipline (and the corresponding process overhead) to achieve that, which is very difficult to follow in practice. On the other hand, a reverse engineered visual design is just too complex to be useful.

Another observation is that there is a lot of lost opportunity of code reuse in the prior art. Code reuse is an attractive proposition for saving a lot of duplicated effort of developing and testing the same code, and hence for saving associated costs and time. Unless one cautiously designs reusable libraries or services prior to the development, the code is not reusable; and next time when there is a need for the same code, it gets re-developed from scratch.

Accordingly, there exists a need to provide a system and method to isolate complex design into manageable components, which overcomes drawbacks of the prior art method.

OBJECTS OF THE INVENTION

An object of present invention is to develop components independently of each other, and similarly develop application flow independently of component development Yet another object of the present invention is the flow becomes a natural documentation and is always in synch with the actual working of the application. This would be managed through a change process of first making changes to the flow visually, which would prompt code changes in the component implementations, and then making those code changes.

Still, another object of the present invention is to provide code scaffolding (generation of code) to reduce development effort and to bring accuracy in the generated code.

Yet another object of the present invention is to eliminate possibilities of inefficiencies such as unused variables or inefficient control structure, so that the resultant deployable uses memory and processor optimally Yet another object of the present invention is to create a way for the individual components to be outsourced to external workers (freelancers) for development, testing or both.

SUMMARY OF THE INVENTION

In one aspect, the present invention provides a system for creating one or more deployable applications and source code thereof using reusable components. The system comprises of an input and output unit, a memory unit, a processor unit and a storage unit. The memory unit includes a repository, a flow/project, a developer's workbench, an assembler's workbench and a monitoring workbench. The repository includes reusable components. The flow/project consists of component connectivity information comprising control flow and data flow. The developer's workbench allows a user to work with the repository. The assembler's workbench allows a user to work with the flow/project. The components in the repository along with component connectivity information of the flow/project are burnt to create the source code of a deployable application using the assembler's workbench. The monitoring workbench allows visual monitoring of the deployable application.

In another aspect, the present invention provides a method for creating a deployable application using reusable independent components. At first step, the method involves creating component definitions in one or more repositories and creating project flows. At second step, the method involves generating code stubs (code templates) and adding custom implementation to those stubs along with any code dependencies, together creating the component implementations. The method comprises of an alternative way of adding these custom implementations and/or unit test cases through test bundle creation and import. At next step, the method involves burning, which involves processing the flow, the component definitions and implementations together to form the deployable application. Further, a monitoring step involves supporting run time debugging by connecting to a live application, or by processing detailed logs generated from the deployed application.

DETAILED DESCRIPTION OF THE INVENTION

The foregoing objects of the invention are accomplished and the problems and shortcomings associated with the prior art techniques and approaches are overcome by the present invention as described below in the preferred embodiment. This present invention is illustrated with reference to the accompanying drawings, throughout which reference numbers indicate corresponding parts in the various figures. These reference numbers are shown in bracket in the following description.

Figure 1:
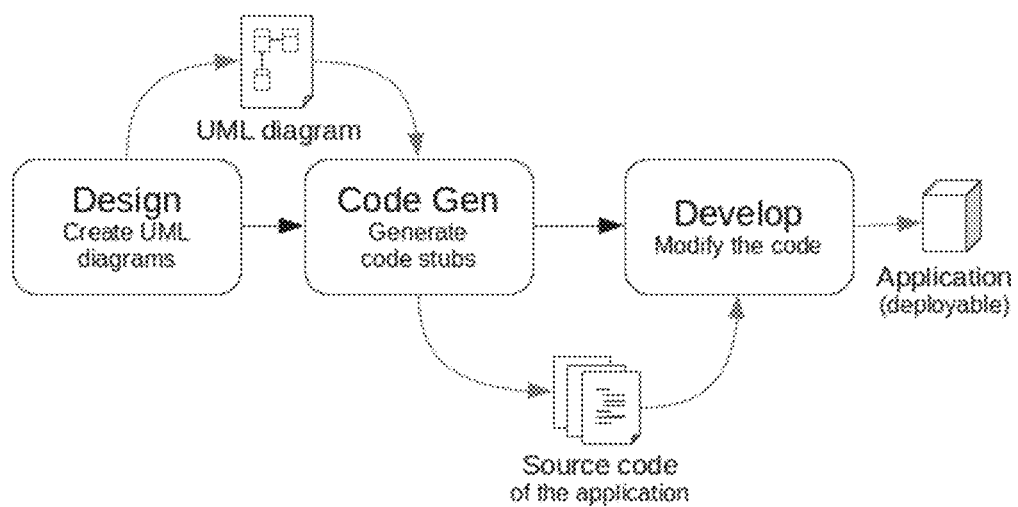
FIGS. 1 and 2 show block diagrams of UML tools' approach and visual programming approach, in accordance with the prior art.
Figure 2:
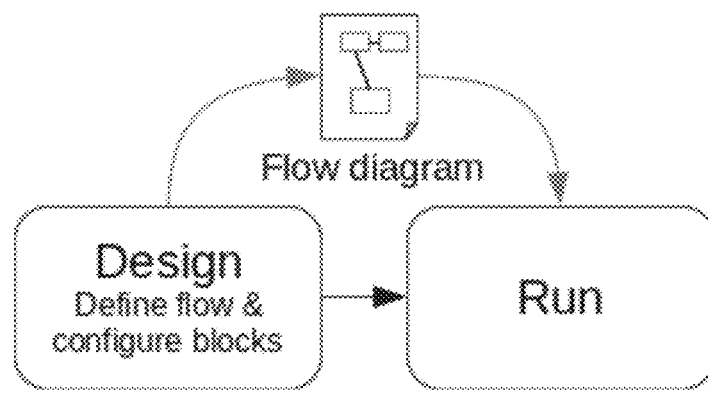
Figure 3:
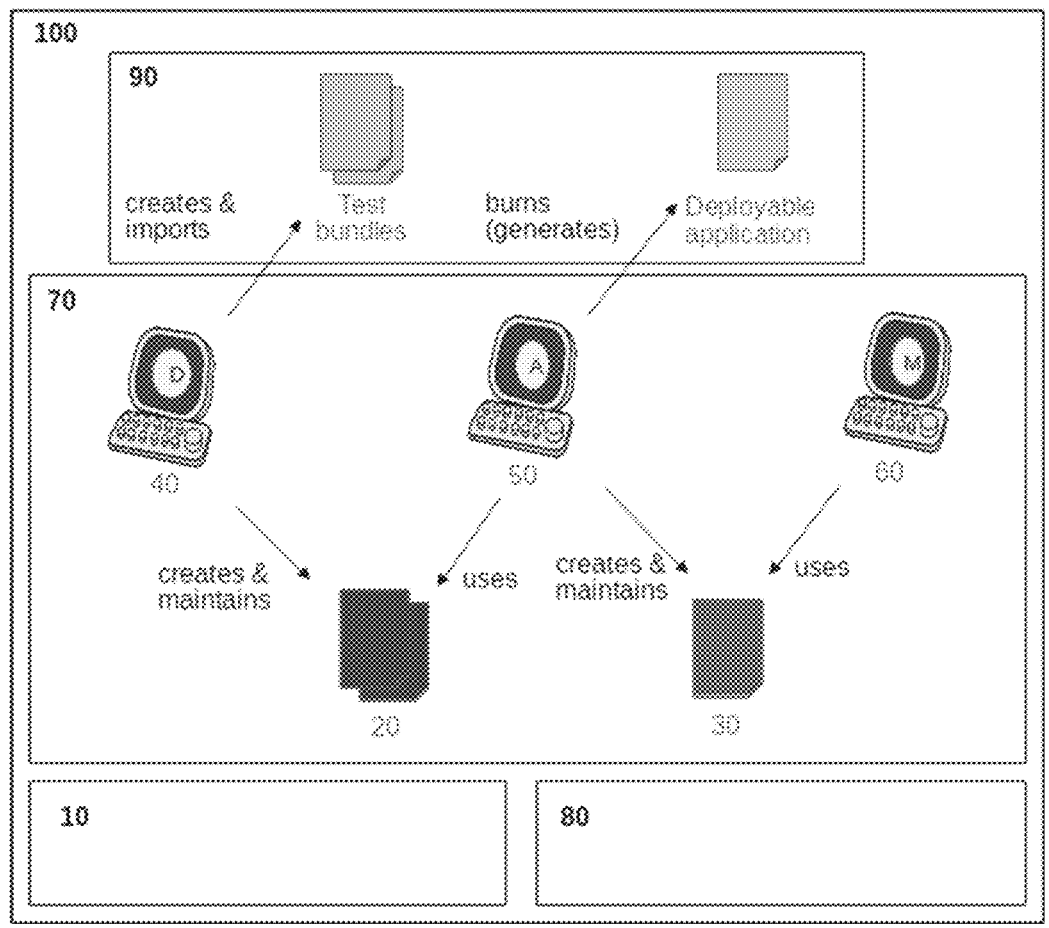
FIG. 3 shows block diagram of a system for creating one or more deployable applications and a source code thereof deployable application using reusable components, in accordance with the present invention.

The Model:

Referring now to the FIG. 3, there is shown a system (100) for creating a deployable application using reusable independent components, in accordance with an aspect of the present invention. It is to be noted herein that the system (100) herein is interchangeably referred as "Xsemble", a term coined by the Applicant herein which the Applicant desires to utilize for branding, marketizing and commercializing one or products/solutions/services that are developed or will be developed in future covering the contents of the specification herein. The system (100) comprises an input and output unit (10), a memory unit (70), a processor unit (80) and a storage unit (90). The input and output unit (10) includes a keypad and a display unit for enabling user interaction. The memory unit (70) is capable of storing a plurality of processing instructions. The processor unit (80) is capable of communicating with the memory unit (80) to issue the plurality of processing instructions stored in the memory unit (80). The storage unit (90) is in communication with the processor unit (80). The storage unit (90) stores the deployable applications.

The memory unit (70) comprises of one or more repositories (20), one or more flow/project (30), a developer's workbench (40), an assembler's workbench (50) and a monitoring workbench (60).

The repository (20) consists of reusable components. The flow/project (30) is a directed graph which represents the control flow and data flow within the application. Some of the nodes in the flow/project are instances of the reusable components in the repository (20). The components along with node connectivity information are burned together to create the complete source code of a single or multiple deployable applications.

In an embodiment, the repositories and flow/projects belong to namespaces. There can be any number of repositories and projects that belong to a namespace. In a specific embodiment, the repository and project artifacts are stored as files, are organized as separate folders under the namespace folder.

The developer's workbench (40) allows a user to work with repository (20) while the assembler's workbench (50) allows a user to work with the flow/project (30). The monitoring workbench (60) uses the project information for live monitoring of the application. FIG. 3 shows an overview of the system (100). The burning of the application is a non-programmatic activity, and is done through the assembler's workbench (50).

The Repositories and Reusable Components:

A repository (20) consists of two types of reusable components i.e. data types and executable functions. These reusable components may be seen as the fundamental building blocks of software, in a way molecules are the fundamental building blocks of a material. In an embodiment, the IDs of these components are strings which are unique within the repository.

The present invention makes a clear demarcation between a component definition and component implementation. The component definition is the information about the component, such as its name, repository name and ports as applicable. On the other hand, the component implementation is the underlying implementation code in a programming language and any dependencies thereof. Thus, the component definition is independent of programming language and the implementation is specific to a language.

Figure 4:
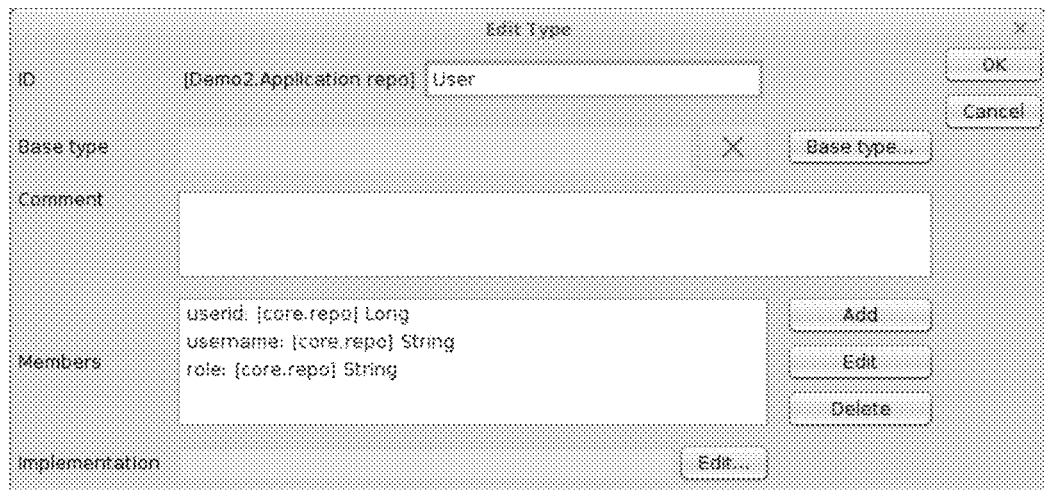
FIG. 4 shows an example of the edit dialog of data types, in accordance with the present invention.

The data types define the type of information that a variable would hold. In an embodiment, simple data types are pre-defined in a "core" repository. In yet another embodiment, the data types may be defined in the repository and can have members of other data types. In yet another embodiment, there may be an inheritance relationship between the data types. Thus, the data types can be interrelated through association, aggregation, composition, generalization relationships. FIG. 4 illustrates this point with a dialog box that edits the "User" data type which does not inherit from any base type but contains 3 members. The member userid has the data type Long as defined within "core.repo" repository, and the members username and role have data type String from "core.repo" repository.

Figure 5:
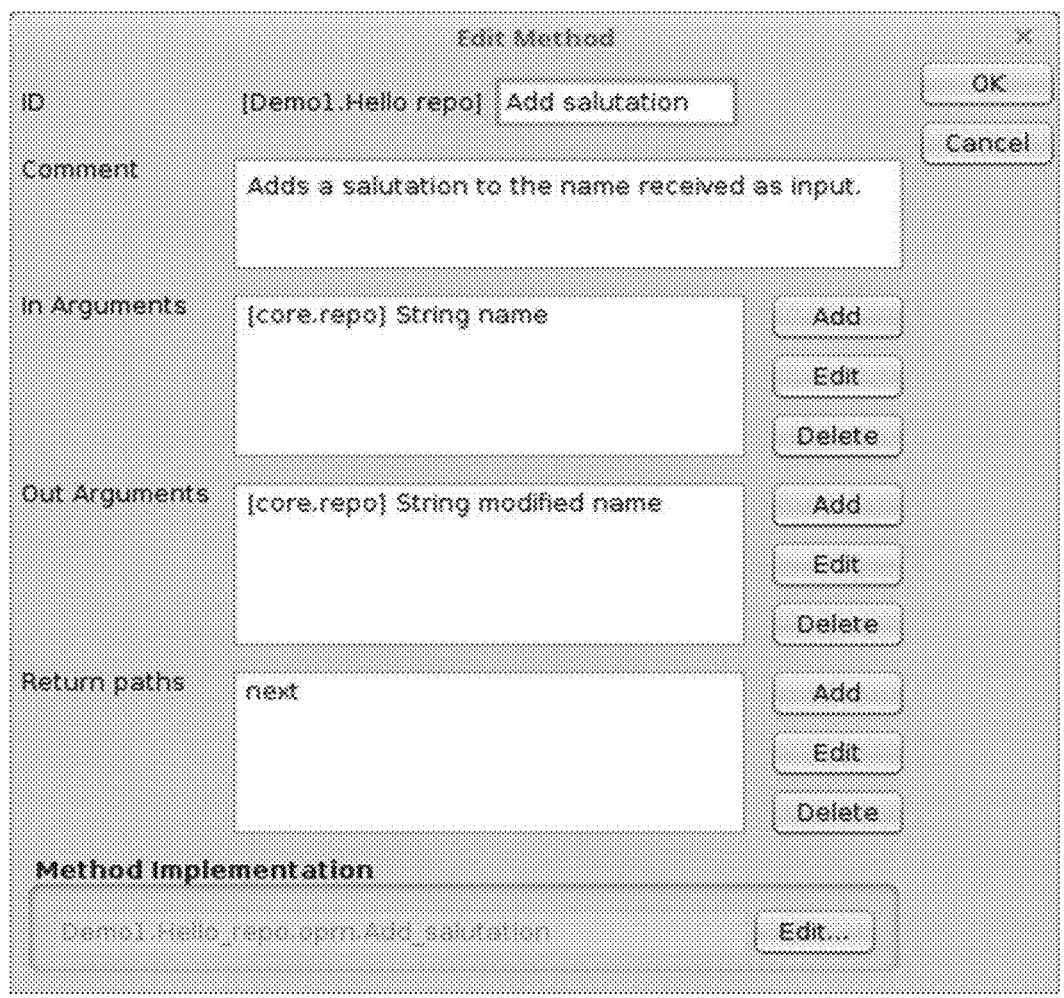
FIG. 5 shows an example of edit dialog of a method node, in accordance with the present invention.

A function is an isolated unit of execution. A function has a unique id, a comment, ports and implementation. FIG. 5 illustrates these attributes of a function through an edit dialog box. The function port is a connection port and it is used by the instances of the function (in flow/project) to make connections. The connection ports are of three types i.e. 'In arguments' (inlets), 'Out arguments' (outlets) and 'Exit paths'. The 'In arguments' are conceptually similar to the arguments passed to a method in a programming language. They are the ports for an instance of the function to receive data. Conversely, the 'Out arguments' are the ports for sending data out. There can be any number of the In and Out arguments associated with a function. The In and Out arguments each have a data type. The 'Exit paths' are the possible outcomes of a function. A common example is a function having two different 'Exit paths', one for "success" and the other for "failure". Again, there can be any number of the 'Exit paths' associated with the function. Thus, the In and Out arguments are data ports, and the 'Exit paths' are the outgoing control flow ports. There are three types of functions, i.e. methods, pages and entry points.

1. Methods are processing units. The methods are isolated execution blocks of business logic. They correspond to the methods, functions or subroutines as defined in various programming languages.

2. The page component facilitates user interaction. In an embodiment, the page would correspond to a single screen or a part of the screen (that could either be embedded into a screen or shown as a popup window). In a web application embodiment, the page could be a web page or a part of it, in a desktop application it could be a frame or a dialog box, in a mobile application it could be a screen or a part of it. Beyond the desktop and mobile screens and peripherals, especially from the IoT perspective, the user interaction could be about interacting with an appliance, where the appliance acts as the user, and hence that means of interaction qualifies as a page. Further, a page also represents the data passed from one architecture layer to another irrespective of whether the data is displayed to a user or not.

Typically, the page uses the In arguments data to give feedback to the user through a user Interface. The out arguments represent the data entered by the user (or is captured automatically by the page), and the exit path corresponds to the user action on the page.

3. The entry point is the "callee" when one architecture layer needs to communicate with another architecture layer. The entry point thus facilitates data exchange between two architectural layers. For example, when the information gets passed from the web layer (the browser) to the server layer, then the data needs to be translated from HTTP format to the server's native format. Various web technologies achieve this through technology specific request and response objects. The entry point takes in these objects and populates the out arguments corresponding to the server layer technology based on it. In an embodiment, the entry point would contain a callback to hold the logic which is called while exiting from the layer. There are some special entry points called as the app startup entry points. Such entry points generalize the entry point behaviour, so as to offer a mechanism to fire the execution engine in response to some event, such as a scheduled batch job or a message received from a middleware system.

Figure 6:
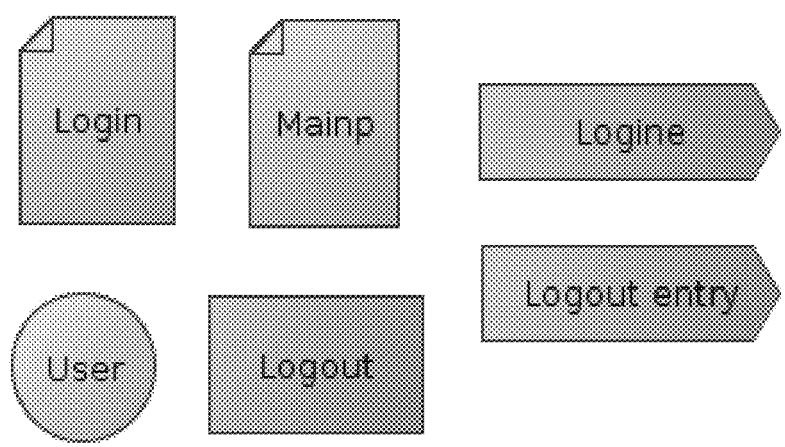
FIG. 6 shows block diagram of the developer's workbench, in accordance with the present invention.

FIG. 6 illustrates all types of reusable components: Login and Mainp are page components, User is a data type, Logout is a method component, and Logine and Logout entry are the entry point components. Note that a type of component corresponds to a unique shape. A repository may be defined to be dependent on any number of other repositories, so that it can refer to the contents of the other repository. Some specific use cases of such reference are the association of the in/out arguments of an execution node with the data types from another repository, or extending a data type defined in another repository by a data type in the dependent repository. In the illustrations of FIGS. 4 and 5, the types from core.repo repository could be used in another repository because of the dependency of that repository on core.repo.

Figure 7:
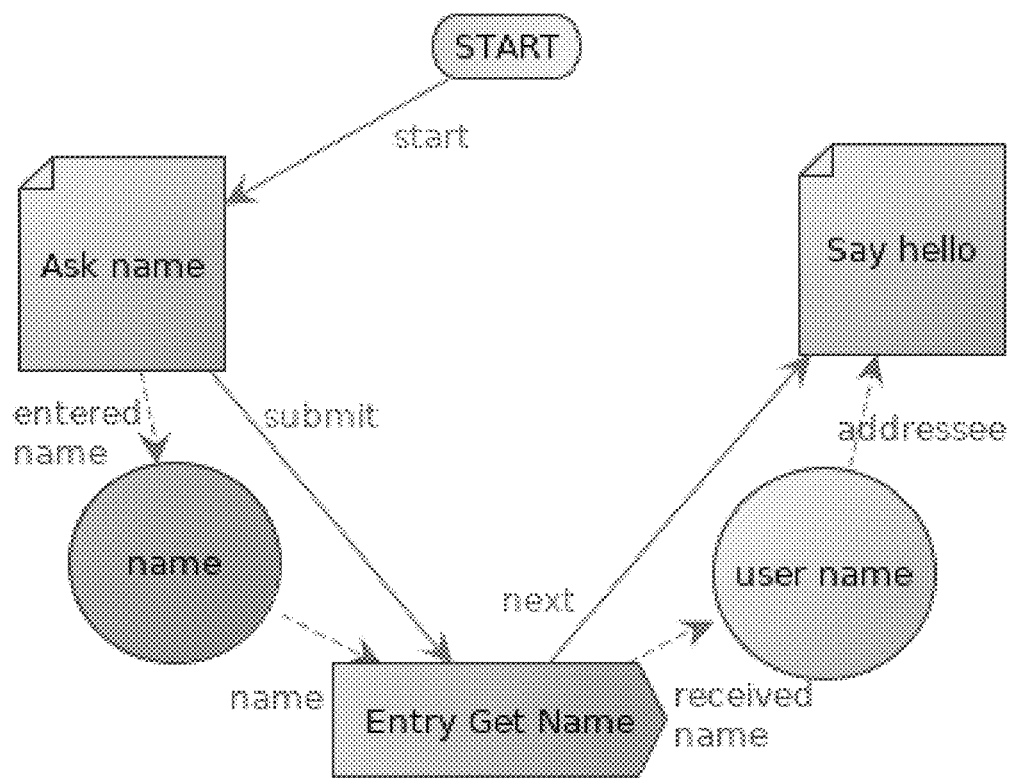
FIGS. 7, 8 and 9 indicate illustrations of flow/projects, in accordance with the present invention.
Figure 8:
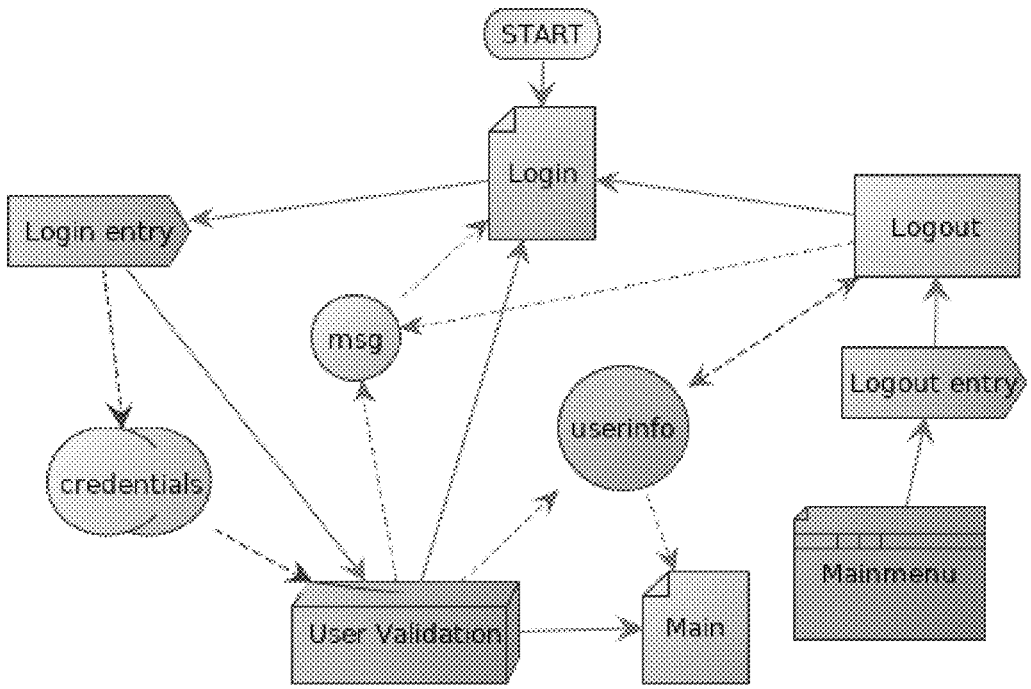
Figure 9:
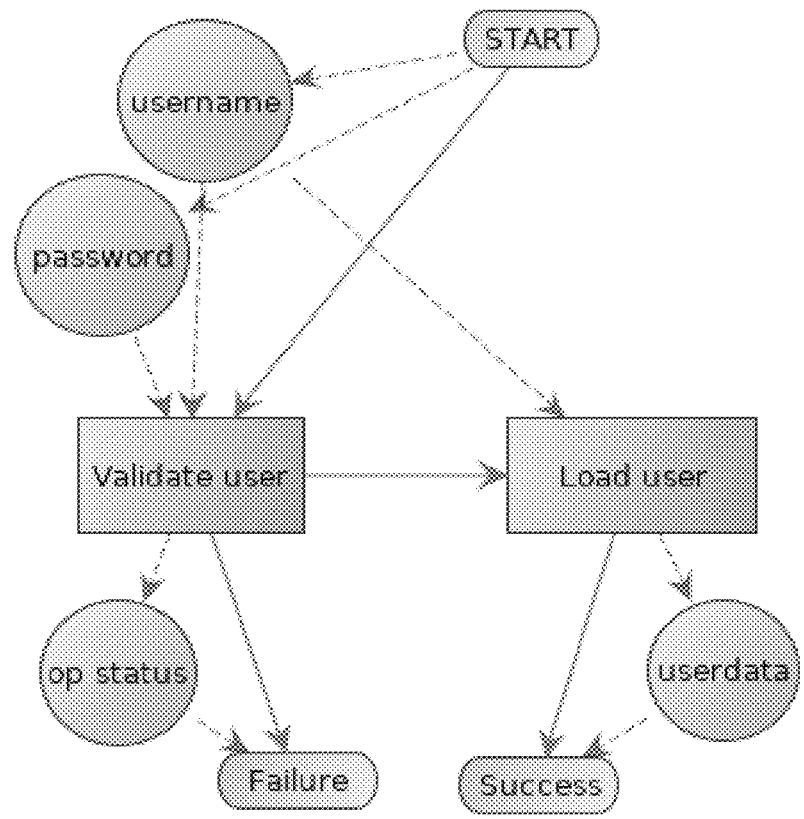

The Project and Nodes:

The flow/project (30) contains various nodes and their interconnections making the projects directed graphs. FIGS. 7, 8 and 9 are illustrations of such directed graphs. Different shapes represent different types of nodes. Some of the nodes are instances of the reusable components in the repository (20). There could be more than one instances corresponding to a single reusable component, within a project or across projects, and this is the facility that promotes code reuse. For a project to refer any component from a repository, one has to define dependency of such a project on the repository. There are four types of instance nodes in the flow/project (30).

1. A variable (also called as the data node) is an instance of a data type. The variable holds a value at runtime. In FIG. 8, msg and userinfo aredata nodes.

2. Further, a method instance (also called as method instance node) is an instance of the method component. In an embodiment, different instances of the same method component at different points in the flow may be required. In FIG. 8, Logout is a method instance node.

3. Furthermore, a page instance (also called as page instance node) is an instance of a page component. In an embodiment, different instances of the same page at different points in the flow may be required. In FIG. 8, Login and Main are the page instances.

4. Moreover, an entry point instance is an instance of an entry point. In an embodiment for a web entry point, the entry point instance is linked with a unique URL, and it gets invoked when that URL is invoked. In another embodiment, corresponding method of an entry point instance would additionally get invoked at the time of exiting the architectural layer. In yet another embodiment, corresponding methods of an entry point instance may get involved in lifecycle events (such as application start/end). In FIG. 8, there are two entry points: Login entry and Logout entry.

All such instances inherit the ports from their base reusable components. These ports are used to interconnect these nodes within a flow/project (30), which enables these nodes to take part in the control and/or data flow as described later.

Apart from the instances of reusable components as described above, there are more types of nodes which can be contained within the flow/project (30).

1. The flow/project (30) comprises of data group nodes. A data group node is a collection of several data nodes grouped together, which typically have a common source, common scope and many times a common destination too. Data group nodes are used to reduce the clutter of data nodes. In FIG. 8, credentials is a data group node.

2. The flow/project (30) comprises a start node. There is one and exactly one start node within a project. By default, the project execution starts from the start node. FIG. 8 shows the start node named START.

3. The flow/project (30) further comprises subproject nodes. A subproject node within a project represents another project (called as a subproject or a child project). When a subproject node is invoked, in turn the control passes to the child project, specifically starting execution from the child project's start node. After the execution of the child project, the control comes back to the parent project. The subproject nodes allow one to create flow diagrams that are hierarchical and substantially less complex for human understanding. FIG. 8 has a subproject node named as User Validation. It represents the project Demo2.User Validation which is shown in FIG. 9.

4. The flow/project (30) furthermore comprises finish nodes. A finish node represents end of execution within the project. The control jumps to the parent project when a finish node is encountered. The name of the finish node becomes the exit path of the subproject node in the parent project. There could be any number of finish nodes within a project. FIG. 9 shows two finish nodes: Failure and Success.

5. The flow/project (30) also comprises menu node. Menu node is a special node which represents the files that gets included on one or more pages. Typical examples of such files are the top menu, side menu, header, footer. The purpose of creating menu nodes as opposed to simply files to include would be to take advantage of the dynamic node linking facility provided in the present invention, whereby the url of the destination is dynamically made available. The menu node is not supposed to have any processing on its own but contains links to the next functionality. Specifically, control never comes explicitly to the menu node; but goes to a page which includes the menu node. FIG. 8 shows a menu node named Mainmenu.

Because of the facility of referencing projects within projects as subproject nodes, a project hierarchy, also called as the project tree is created.

Architectural Layers:

The flow/project (30) can correspond to one or more architectural layers, and the nodes present in the project also correspond to the architectural layers. Some nodes belong to a single architectural layer, whereas some nodes lie at the intersection of two architecture layers. As an example of the later, consider a web page implemented in PHP. Its inputs side is in the server layer, as the in arguments are processed by the PHP code that runs on the server. However, the page is displayed in a web browser in the web layer. Therefore, the output side of this page is in the web layer. The page thus sits on the boundary between the server layer and the web layer. As another example, consider a web page sending some data to the server over an HTTP request. The variables corresponding to this data sent are instantiated from the web layer and consumed from the server layer, and hence fall on the boundary between the two layers. Some examples of the architecture layers could be: the web layer, application server layer, job layer, standalone execution layer, mobile layer etc. Also, depending on the context and/or the deployment technologies the layers which fall in similar category may be different. For example, the mobile layers using technologies Android vs iOS would be physically different. As another example, two microservices, although deployed on the same application server such as tomcat, are physically separate and hence would be considered as two distinct layers.

This layers concept is used while creating the node connections to disallow certain possibilities. An example is that the direct connection between a method instance in a mobile layer and a method instance in the server layer would not be allowed; whereas direct connection between method instances belonging to same layer would be allowed.

Connections Among the Nodes:

The various nodes that are part of the flow/project (30) are interconnected in a project, making a project a directed graph. A control link connects two execution nodes (all except the data and data group nodes). The data nodes or data group nodes do not take part in the control flow, and consequently do not have any control links connected to them. Each data link connects one execution node and a data node.

Every execution node makes these connections based on its ports:

The method instance, page instance and entry point instance nodes inherit their ports from their base functions. They can connect to data nodes or members of data group nodes with their respective in and out arguments. In an embodiment, each port can connect to at most one data node or a member of a data group node. These nodes can connect to other execution nodes at their exit path ports with outgoing flow links. In an embodiment, each exit path can connect to at most one other execution node.

The menu nodes has its ports defined as a part of its definition, and those can be used for connections.

All execution nodes except menu nodes and start nodes accept any number of incoming flow links.

Menu nodes and start nodes do not accept any incoming flow link or any incoming data link.

The finish nodes do not accept any outgoing flow link or outgoing data link.

The subproject node's exit paths correspond to the finish nodes in the child project that it represents. In an embodiment, the subproject node's in arguments become the out arguments of the start node in the child project, and the subproject node's out arguments become the in arguments of the finish nodes in the child project. Such in and out argument ports can be defined for the start and finish nodes, and then the subproject node's ports (in the parent project) get defined from those.

The data nodes do not have any predefined ports, and they accept any number of input and output data links.

FIG. 7 shows an example of application flow with a simple "Hello" web application. The application asks the user her name on the first web page, and shows "Hello" prepended to it on the next. The application uses the following nodes:

1 Start node: START, belonging to the server layer
2 Page instance nodes: Ask name, Say hello, both at the intersections between the server layer (input side) and web layer (output side)
1 Entry point instance: Entry Get Name, belonging to the server layer
2 Data nodes: user, user name—the 'user' data node falling on the intersection of the web layer and the server layer and the 'user name' node contained within the server layer.

In FIG. 7, both the control flow and data flow are seen distinctly. The control flow is represented by solid arrows and the data flow is represented by dashed arrows. Having combined both the control flow and the data flow in a single directed graph, and having shown all the data nodes along side the execution nodes, the flow diagram in this invention is distinctly different from a conventional flowchart or a UML activity diagram. The flow diagram is an accurate and explicit representation of the flow of the application.

In an embodiment, a reusable component could be associated with one or more implementations and each implementation is associated with supported technologies. A technology is uniquely identified by the name of the technology and its version. A component implementation may be associated with multiple versions of a technology. On the other hand, each architectural layer is associated with a platform and a platform is associated with its supporting technologies. This information can be used to assess the technology compatibility of the component implementations with the deployment platform on which an instance of the component is expected to be deployed. At the time of creating the interconnections within the nodes, the layers to which the nodes belong (on their input and output sides) filter the nodes that could be connected based on this technology compatibility assessment.

The flow links connect the execution nodes in the same layer, except when the destination is an entry point instance node in another layer. As an example, in a web application, the page instance or the menu node have their output in the web layer, and so they cannot connect their flow outputs (corresponding to an exit path) to any node in the server layer except an entry point node. On the other hand, such a page instance or menu node would be able to connect to a method instance node that belongs to the web layer. The labels "start", "submit" and "next" are the names of the exit path ports of the START, Ask name, and Entry Get Name nodes respectively. As seen in FIG. 7, these execution nodes are connected to other execution nodes at these ports. Similarly, the labels "entered name" and "received name" are the names of the out arguments of the "Ask name" and "Entry Get Name" execution nodes respectively; and the labels "name" and "addressee" are the names of the in arguments of the "Entry Get Name" and "Say Hello" execution nodes respectively. The execution nodes are connected with the data nodes using these in or out arguments as seen in FIG. 7. In an embodiment, these labels are not shown on the diagram to avoid clutter, but they are available for examination through other means such as in a dialog box that comes after double-clicking the node. Similarly, the data links connect the data nodes (or individual members of data group nodes) with an execution node in the same layer. In addition to the layer, in an embodiment, the type compatibility is also checked in a fashion similar to that in a statically typed language.

Alternate Flows:

The flow model presented above is an 'imperative' flow model where the flow is completely specified. The flow could also be 'declarative'. In a specific embodiment, prerequisite dependencies among the nodes are specified and the prerequisite nodes are executed to satisfy the dependency relations without being a part of the imperative flow. As an example, the instantiation of a variable may need execution of a method instance (a declarative dependency), and therefore the method instance would get invoked automatically when the variable value is needed, without a flow link explicitly invoking the method instance node. In another embodiment, the graph processing may become smarter and do a flow optimization to execute some components in parallel, taking advantage of the multiple CPUs on a machine or distributing the processing across multiple processors, as allowed by the technology of the corresponding architectural layer. This possibility is easier in the present invention because strict modularity is maintained in the execution and the execution logic is embedded in automatically generated glue code.

Figure 10:
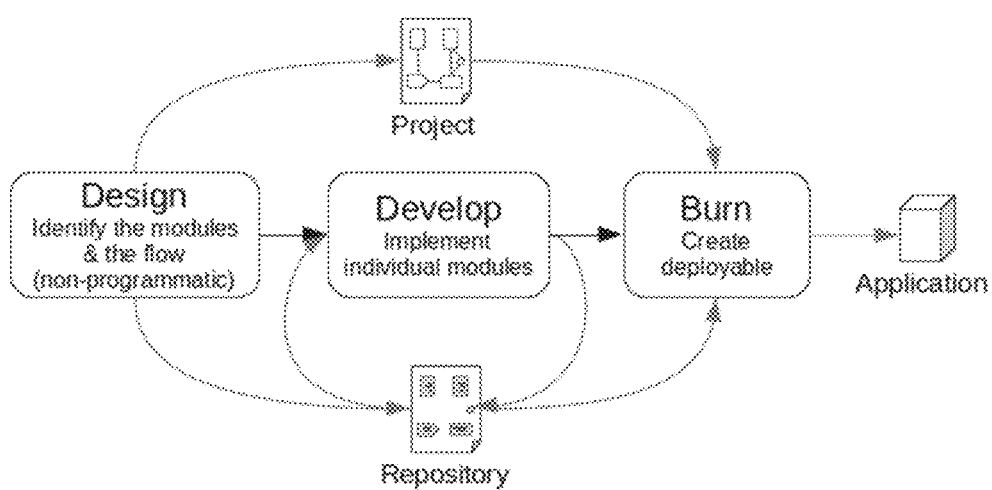
FIG. 10 shows a block diagram of user workflow, in accordance with the present invention.

Method for Creating One or More of Deployable Applications:

In another aspect, there is shown a method for creating one or more deployable applications and a source code thereof using reusable components and monitoring the deployable at run time visually, in accordance with the present invention. The method is described in conjunction with system (100) as shown in the FIG. 3 and the user workflow as shown in FIG. 10.

Step 1: Design: The user workflow comprises designing step. The designing step includes creating the component definitions in one or more repositories (20) using the developer's workbench (40) and creating project flows (30) using the assembler's workbench (50). The end result is the component definitions in one or more repositories (20), and flow diagrams in one or more projects (30). Often, the design is an iterative process, starting with the needs of the project, the design of the project/flow (30), and making required changes to the repository (20) in terms of component addition/update/deletion. In an embodiment, the developer's workbench (40) and the assembler's workbench (50) help the user in this process.

Figure 11:
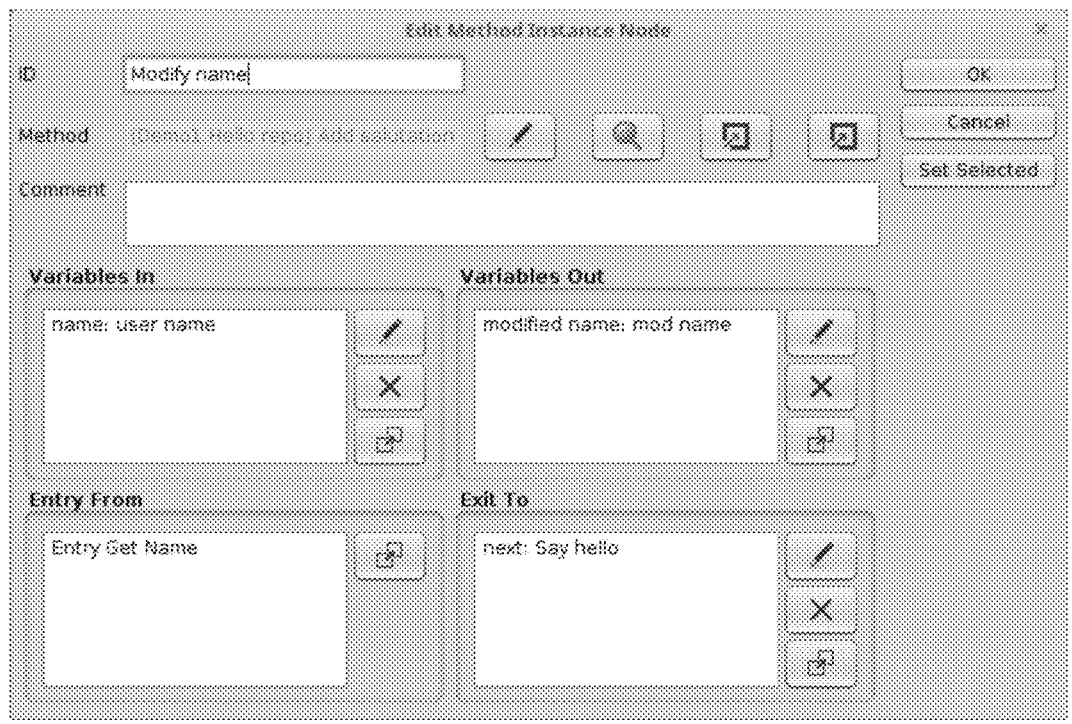
FIG. 11 shows an edit dialog of a method instance node, in accordance with the present invention.

With reference to illustrations in FIGS. 5 and 11, FIG. 5 shows the edit dialog of a method Add salutation from repository Demo1.Hello repo, whereas, FIG. 11 shows the edit dialog of a method instance node Modify name, which is based on this method node. In the method, the component definition comprising the in arguments, out arguments and return paths (same as exit paths) is editable, so that new arguments or exit paths can be added and existing ones may be modified or deleted. On the other hand, in the method instance node, the definition is inherited from the method node. Specifically, ports or exit paths cannot be modified, but only connected to other nodes within the project (or in some cases from another project).

Figure 12:
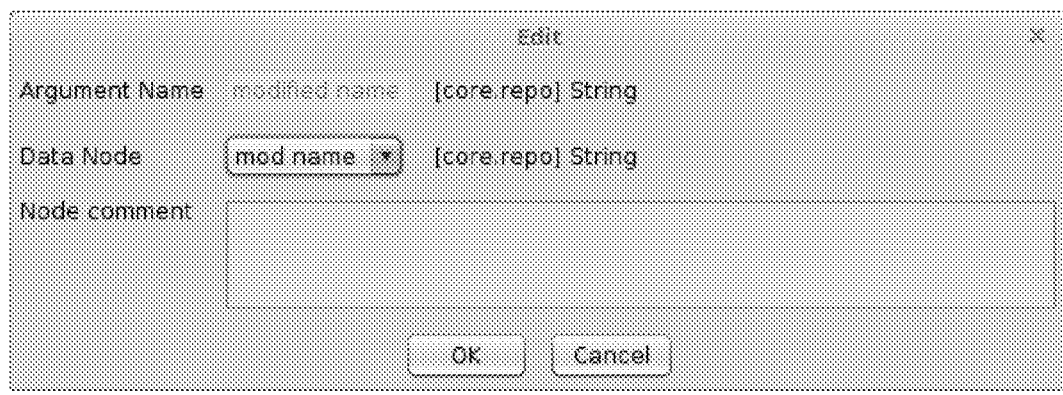
FIG. 12 illustrates a process of connecting a port to an existing data node, in accordance with the present invention.

FIG. 12 illustrates the process of connecting a port to an existing data node, where the data type associated with both are shown, so that their compatibility is assessed. This makes it possible to implement type safety at the node connection level, even in cases where the underlying programming language does not support static typing, such as PHP. This is a unique aspect of this invention which adds robustness to the resultant application and reduces runtime errors that would happen due to incorrect types.

Figure 13:
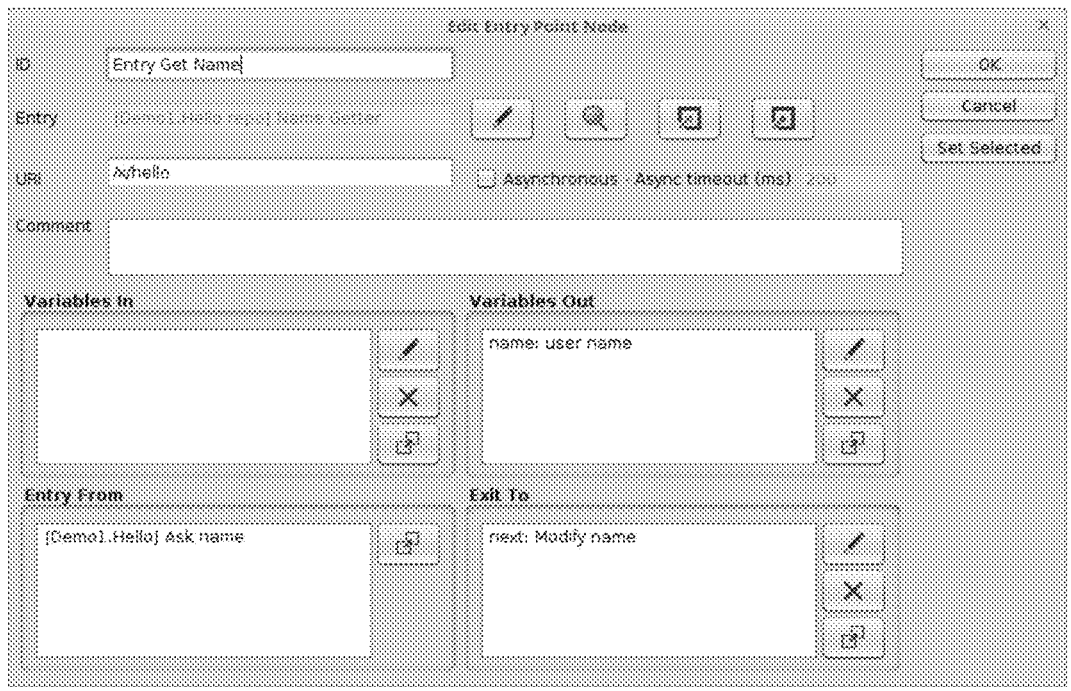
FIG. 13 shows entry point instance edit dialog, in accordance with the present invention.

At the time of design, an entry point instance, especially in a web server layer, is associated with a relative URL, which is used to invoke it. The url is set up explicitly at the design level, so it can even be changed, without any code change. Like the URL, many other design and deployment choices are also made available as design configurations, so that they can be done without programming. As an illustration, please check out the entry point instance edit dialog in FIG. 13, which shows the URL and the asynchronicity being set up at the entry point instance level. Such configurability is a unique aspect of this invention. It helps to shift the major design decisions from programmers to non-programmers and a way of explicitly checking these design decisions without getting into the codebase.

Step 2: Development:

The user workflow further comprises development step. The developer's workbench (40) uses the component definition to automatically generate the code stubs (also known as code templates) based on a supported technology. A method intended for a PHP server layer will need a PHP implementation, a method intended for a Java server layer will need an implementation of a supported JVM language, whereas a method intended for the web layer will need a Javascript implementation. The present invention uses technology plugins which may be loaded into the developer's workbench to create the code template in the language supported by the plugin.

The below listing shows the generated code template in Java language for a method component, for which FIG. 5 shows the edit dialog. Note how the names in and out arguments form the basis of the names in the generated code template (in this case, by replacing the spaces with underscores). Note also the helpful comments being generated within the code stub. The expectation that a programmer should replace the line marked with TODO with his implementation code is clearly laid out in a comment within the generated code.

```
package Demo1.Hello_repo.oprn;
import java.util.Map;
```

```
import java.util.HashMap;
import org.slf4j.Logger;
import org.slf4j.LoggerFactory;
/**
Adds a salutation to the name received as input.
*/
public class Add_salutation
{
    private static final Logger logger =
LoggerFactory.getLogger(Add_salutation.class);
    public Map<String,Object> run(Map<String,Object>
inargs)
    {
    logger.info("Session:"+ inargs.get ("session")+" -
Entered method " + inargs.get("meth"));
        // Get the in arguments
        java.lang.String name_in = (java.lang.String)
inargs.get("name");
        // Out argument declarations
        java.lang.String modified_name_out;
        // Method exit path
        String exitpath; // Possible values are "next"
        // TODO: Your implementation comes here. Populate the
appropriate values in the out arguments and exitpath.
        // Create outargs and populate it
        HashMap<String, Object> outData = new HashMap<String,
Object>( );
        outData.put("_exitPath",exitpath);
        outData.put("modified name", modified_name_out);
        return outData;
    }
}
```

For a page, the listing below is the example of a generated code template as a JSP implementation.

```
<% /*
-- File: src/main/webapp/Demo1/Hello_repo/Show_Name.jsp
-- Copyright (C) 2017 10Xofy. All rights reserved.
-- Displays the name
*/ %>
<%@ page import="org.slf4j.Logger, org.slf4j.LoggerFactory" %>
<%
    java.util.Map<String,Object> inargs =
(java.util.Map<String,Object>)request.getAttribute("Page Input");
    String pageid = (String)inargs.get ("pg");
    // Get the in arguments
    java.lang.String name2display_in = (java.lang.String)
inargs.get("name2display");
%>
<%! Logger logger = LoggerFactory.getLogger(getClass( )); %>
<% logger.info("Session:"+ inargs.get("session")+" - Entered page
" + pageid); %>
<%-- TODO: Your implementation comes here.
Usual JSP syntax will be applicable.
(a) Variables initialized above may be (and possibly would be)
used in the page.
(b) Use relative paths to include other files/images, such as
../include/header.jsp or ../images/logo.png
(c) You go back to the server by invoking a url
<%=xsemble.controller.PageHelper.getPageActionUrl(pageid,exitPath,
request)%> using any HTTP method (GET/POST etc).
AJAX request is okay.
Examples:
1. <a
href="<%=xsemble.controller.PageHelper.getPageActionUrl(pageid,
exitPath,request)%>">Click here</a>
2. <form
action='<%=xsemble.controller.PageHelper.getPageActionUrl(pageid,
exitPath,request)%>' method='post'>
<input type='hidden' name='pg' value='<%=pageid %>'/>
...
</form>
(d) Pass appropriate parameters which will be used by the page
processor to set the followings:
Out variables:
Exit path (one of these): "next"
Feel free to remove this comment block. It's only for your
reference.
--%>
```

To make the point that there could be the same type of node may be implemented in different technologies, here is an alternative implementation of the same page using plain Java and without using JSP syntax.

```
package Demo1.Hello_repo.page;
import java.util.Map;
import java.util.HashMap;
import org.slf4j.Logger;
import org.slf4j.LoggerFactory;
import java.io.Writer;
/**
Displays the name
*/
public class Show_Name
{
private static final Logger logger =
LoggerFactory.getLogger(Show_Name.class);
public void run(Map<String,Object> inargs, Writer writer )
{
logger.info ( "Session:"+ inargs.get ("session")+" - Entered page "
+
inargs.get("pg"));
// In arguments
java.lang.String name2display_in = (java.lang.String)
inargs.get("name2display");
// TODO: Your page implementation comes here. Write the page
output on the "writer".
}
}
```

Finally, in the case of an entry point, the following listing shows a generated code template in Java.

```
package Demo1.Hello_repo.ent;
import java.util.Map;
import javax.servlet.ServletContext;
import javax.servlet.http.
import java.util.HashMap;
import org.slf4j.Logger;
import org.slf4j.LoggerFactory;
/**
Retrieves the name from the request
*/
public class Name_Getter_entry
{
private static final Logger logger =
LoggerFactory.getLogger(Name_Getter_entry.class);
public void onEntryEnd( ) {
// Add any resource cleanups to execute on request end
}
    public Map<String,Object> onEntryBegin(HttpServletRequest
request, HttpServletResponse response, Map<String,Object>
mInput,
String sessionId, String src)
    {
logger.info("Session:"+ sessionId +" - encountered entry point " +
src) ;
    // Entry Point exit path
    String exitpath = request.getParameter("ret"); //
TODO: Adjust this if needed. Possible values are "next"
    // Out argument declarations
    java.lang.String name = new java.lang.String( );
    // TODO: Your implementation comes here.
    // Create outargs and populate it
    HashMap<String, Object> outData = new HashMap<String,
Object> ( );
    outData.put("_exitPath",exitpath);
    outData.put("name", name);
    return outData;
```

```
    }
  }
```

In case of app startup entry point, the template would change to have additional lifecycle methods onAppStartup( ) and onAppShutdown( ). As the names indicate, the onAppStartup( ) method would be invoked once when the corresponding architectural layer itself is initiated, and the onAppShutdown( ) method would be invoked when the layer shuts down. The purpose of the onAppStartup method is to create the callback hooks (such as registering a listener to a middleware or scheduling batch jobs). The user also has to write the code to capture the callbacks (specific to the hooks, such as when the scheduled batch job is invoked) and fire a workflow execution from that point.

In case of data types, the member definitions may be used to create the stub, which in most cases do not need any further manual processing. Like in other Functions, the implementation is specific to the target language. For example, if the target language is Java then the generated stub is a JavaBean. The listing below shows the listing of the generated Java template for the 'User' type whose editor dialog box is shown in FIG. 4.

```
package Demo2.Application_repo.types;
/**
*/
public class User
{
    // variable declaration
    private java.lang.Long userid;
    private java.lang.String username;
    private java.lang.String role;
    // the getters and setters
    public java.lang.Long getUserid( ){
        return userid;
    }
    public void setUserid(java.lang.Long userid){
        this.userid = userid;
    }
    public java.lang.String getUsername( ){
        return username;
    }
    public void setUsername(java.lang.String username))
        this.username = username;
    }
    public java.lang.String getRole ( ) {
        return role;
    }
    public void setRole(java.lang.String role){
        this.role = role;
    }
}
```

In an embodiment, the generated code can have sophisticated code constructs for logging, error handling and enhanced security; and guidance on how a developer would modify the code. It is worth noting that in none of the generated code templates, there is any mention of anything that is outside the purview of the given node. The functions are completely independent of one another. This is the key to enable independent development of different functions and is unique to present invention. The auto-generation may also involve generation of any editor-friendly files so that the repository files may be opened correctly in the editor.

Figure 14:
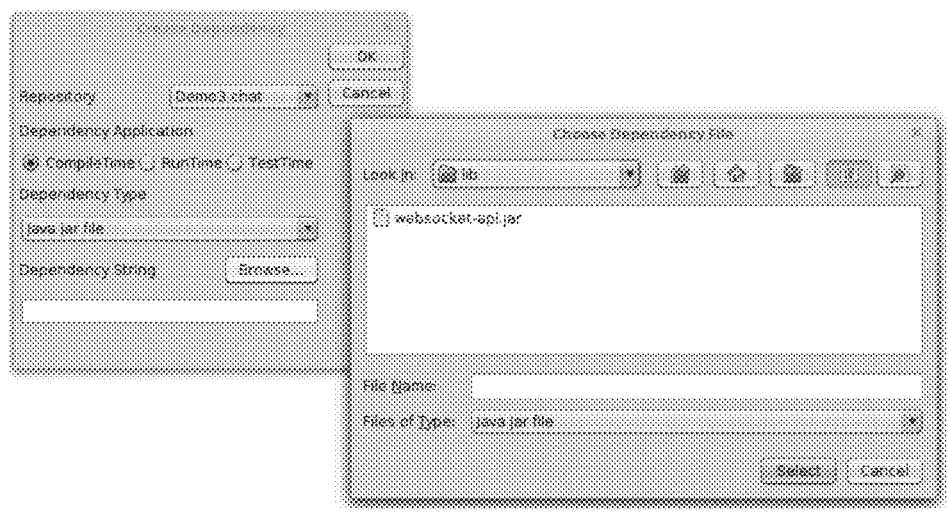
FIG. 14 illustrates the process of adding the dependency, in accordance with the present invention.

The development step furthermore comprises implementing the components. A developer starts with the generated stub, and fills in the implementation. It is possible that a component needs some other files too, and they may be added to the implementation as implementation dependencies. FIG. 14 illustrates the process of adding a dependency of a file. Dependencies could also be declarative, as is common in projects using maven or gradle.

For convenience, multiple implementation dependencies may be grouped together as a dependency group, so that all the dependencies in a dependency group may be added to a component implementation in one shot. An example where this comes in handy is when various javascript files, style sheets and images are needed as dependencies to multiple page components.

In addition to the above dependencies, a function may depend on data types (as the function arguments correspond to these types).

The present invention encourages creating dependencies at component level.

The user workflow moreover comprises implementing menu nodes. The procedure is similar to the components in the repository covered above, however it is done with the assembler's workbench. The links within the menu nodes typically refer to disparate aspects of functionality located in different components across the project tree. The below listing shows the generated code template for a menu node:

```
<% /* -- File: src/main/webapp/include/topmenu.jsp */ %>
<div id="topMenu">
<ul>
<li><a
href="<%=xsemble.controller.MenuHelper.getMenuActionUrl("[Demo2.
Application] Mainmenu","next page", request)%>">Next page</a></li>
<li class="selected"><a
href="<%=xsemble.controller.MenuHelper.getMenuActionUrl("[Demo2.
Application] Mainmenu"logout", request)%>">Logout</a></li>
</ul>
</div>
```

The idea behind making a call to getMenuActionUrl is to avoid hard coding of the URLs in the code. (The URL corresponding to the next node is returned by the function.) The menu implementations are typically included in one or more page implementations. The menu implementations are meant to be trivial, containing ways to navigate to different links based on user actions.

After creating the component implementations, in an embodiment it is an optional feature to provide burn-time parameterization. In this, the developer picks up any string in the implementation and assigns to it a parameter name. For example, the string "localhost" that appears in a component implementation may be chosen for parameterization and assigned a parameter name HOSTNAME.

Step 3: Burn

The user workflow finally comprises burning. The burn process generates the output deployable code. It needs appropriate technology plugins in the assembler's workbench that correspond to the platform(s) where the application would be deployed. Depending on the architectural layers, there could be one or more deployables. For example, if it is a simple 3 tier web application, then there would be a single deployable. On the other hand, if it has more layers such as a mobile layer or various microservice layers, then the number of deployables would be more than one. The output of the burn process is the complete source code of the deployables, and optionally to compile it. The compilation part is not valid if the language does not support compilation.

The burn process runs as follows:
Setting up the output folder.
Putting the component implementations and their dependencies into the output folder.
Generating the glue code.
Creates a build and deployment script if needed
Creates other files optionally While setting up the output folder, the burn process checks if it is an incremental build or a full build. Also, in case of projects having multiple technology layers, the output could be in several subfolders, and set up as several subprojects, depending on the specific technology. In an embodiment, gradle scripts may be used which may use the different folders as subprojects, consisting of other gradle scripts.

Therein after while adding component implementations to the output folder, only those implementations that correspond to the components whose instances take part in the flow/project (30) and their dependencies are picked and get added to the final deployable. This works against a common antipattern where the codebase keeps accumulating unreachable code and unused dependencies over time, and it is challenging to trace which dependencies correspond to what. Thus, the present invention prevents code bloat and reduces disk space and memory utilization.

Further, if the embodiment supports burn-time parameterization, then the new values of the identified parameters may be set by the user before burning and those new values replace the old values in the implementation files while putting those in the output folder. For example, consider a file which contains a string "localhost", and a parameter value "HOSTNAME" is assigned to it. Now, if the user assigned "google.com" to the parameter HOSTNAME, then the "localhost" string in the file in the repository gets replaced by "google.com" when the same file appears in the output folder.

The main aspect of the burn process is to generate glue code that correctly connects the functions which are implemented completely independently as per the Development step. How it is done is explained below with the help of the implementation in a specific embodiment catering to Java JEE technology. Consider the Node interface in the listing below:

```
public interface Node {
public String getId( );
public int getType( );
public Map<String,Object> populateInVariables(final VarStore
varStore, final HttpServletRequest request, final String
sessionAndRequestId);
public Map<String,Object> execute(final Map<String,Object> inVars,
final RuntimeContext runtimeContext, final String
sessionAndRequestId);
public String updateVarStore(final Map<String,Object> outVars,
VarStore varStore, final String sessionAndRequestId);
public Node nextNode(final String ret, final String
sessionAndRequestId);
}
```

The EntryNode interface extends it as shown below:

```
public interface EntryNode extends Node {
public void onRequestEnd( );
public void onMessage( );
}
```

Figure 15:
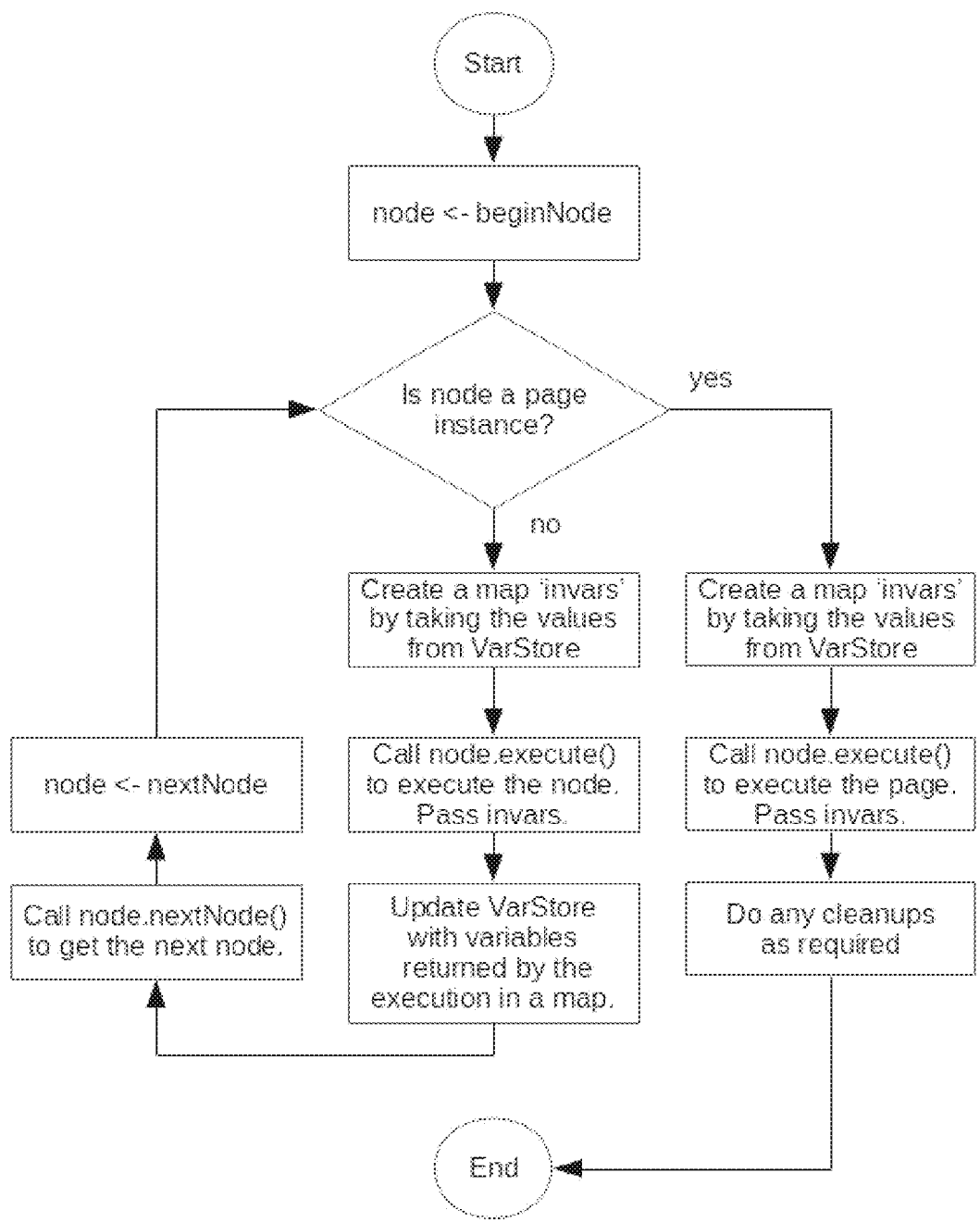
FIG. 15 illustrates an flow chart of the controller generated in the burn step, in accordance with the present invention.

The representation of every node that appears in the project tree implements the above Node interface. A Workflow object is created by passing it the runtime context object, and the workflow execution is started by executing the method executeWorkflow, passing beginNode as a parameter (which signifies which node the execution should start from). The below listing shows the Workflow class that implements a simple execution flow where the node objects are obtained based on the connectivity information and then they are executed one after the other in an infinite loop. FIG. 15 shows a simplified flowchart of the execution corresponding to this listing which may aid in better understanding:

```
public class Workflow {
private final VarStore varStore;
private final RuntimeContext runtimeContext;
private static final Logger log =
LoggerFactory.getLogger(Workflow.class);
public Workflow(RuntimeContext runtimeContext) {
this.runtimeContext = runtimeContext;
varStore = new VarStore(runtimeContext);
log.info("Session:"+ runtimeContext.sessionId + '/' +
runtimeContext.requestId + " - Workflow: Initialized");
}
public void executeWorkflow(Node beginNode) {
final String sessionAndRequestId = runtimeContext.sessionId + '/'
+ runtimeContext.requestId;
log.info("Session:"+ sessionAndRequestId +" - Workflow: Beginning
with " + beginNode);
Node node = beginNode;
do {
if (node.getType( ) == 2 || node.getType( ) == 3)
break;
Map<String,Object> invars = node.populateInVariables(varStore,
runtimeContext.request, sessionAndRequestId);
log.info("Invars "+invars);
Map<String,Object> outvars = node.execute(invars, runtimeContext,
sessionAndRequestId);
log.info("Outvars "+outvars);
String exitPath = node.updateVarStore(outvars, varStore,
sessionAndRequestId);
Node next = node.nextNode(exitPath, sessionAndRequestId);
log.info("Session:"+ sessionAndRequestId + " - Workflow: " + node
+ " –>"+next);
node = next;
}
while (true);
Map<String,Object> invars = node.populateInVariables(varStore,
runtimeContext.request, sessionAndRequestId);
node.execute(invars, runtimeContext, sessionAndRequestId);
    runtimeContext.cleanup( );
if (beginNode instanceof EntryNode)
((EntryNode)beginNode).onRequestEnd( );
}
```

The VarStore holds the variable values in various scopes. The following listing shows how the maps that hold the variables from various scopes are initialized within the constructor of VarStore:

```
public VarStore(RuntimeContext runtimeContext) {
varReq = new HashMap<String,Map<String,ValRecord>>( );
varSes = initSessionStorage(runtimeContext);
varApp = initApplicationStorage(runtimeContext.servletContext);
}
```

The initSessionStorage( )method uses the infrastructure provided by the underlying technology to ensure that another instance of VarStore for the same application user will get access to the same values.

```
public Map<String,Map<String,ValRecord>>
initSessionStorage(RuntimeContext runtimeContext)
{
if (runtimeContext.request != null) {
HttpSession session = runtimeContext.request.getSession( );
@SuppressWarnings("unchecked")
HashMap<String,Map<String,ValRecord>> projSes =
(HashMap<String,Map<String,ValRecord>>)session.getAttribute
("_mgf");
if (projSes == null) {
projSes = new HashMap<String,Map<String,ValRecord>>( );
session.setAttribute("_mgf", projSes);
}
return projSes;
}
else { // Websocket session, stored in servletContext
@SuppressWarnings("unchecked")
HashMap<String,Map<String,ValRecord>> projSes =
(HashMap<String,Map<String,ValRecord>>)runtimeContext.websocket
Session.getUserProperties( ).get("_mgf");
if (projSes == null) {
projSes = new HashMap<String,Map<String,ValRecord>>( );
runtimeContext.websocketSession.getUserProperties( ).put("_mgf",
projSes);
}
return projSes;
}
}
```

In a similar fashion, the implementation of initApplicationStorage uses the underlying technology infrastructure to initialize the map of the application scope values.

```
public Map<String,Map<String,ValRecord>>
initApplicationStorage(ServletContext servletContext)
{
if (servletContext == null) return null;
@SuppressWarnings("unchecked")
Map<String,Map<String,ValRecord>> projApp =
(Map<String,Map<String,ValRecord>>)servletContext.getAttribute
("_mgf") ;
if (projApp == null)
{
projApp = new HashMap<String,Map<String,ValRecord>>( );
servletContext.setAttribute("_mgf",projApp);
}
return projApp;
}
```

A VarStore object thus stores the variables of various scopes into different maps. Note that the concept of scopes is specific the platform and the technology. This illustration for Java JEE technology demonstrates how the request, session and application scopes are dealt with. The important point to note is how the infrastructure provided by the technology is utilized by the VarStore while creating the key-value structures (maps) where the variables are stored.

The key in each of the maps projApp, projSes and projReq is the project suffix and the value is another map. The project suffix is the pointer to the place of a project in the project tree. The value which is a map contains the values of all the data nodes and data group members in the given project against the id of the node (combined with the member name in case of data group node). The id is the unique id of the node within the project. In an embodiment, the value stores runtime metadata information such as which node set up the value and its timestamp, along with the variable value.

Using this mechanism, a VarStore object becomes the complete store of information of the variable values and some metadata about the origin of the values. In other embodiments, it is possible to use some other implementation such as a Caching system for storing the runtime values.

The implementations of the Node interface correspond to the nodes in the projects belonging to the project tree. They are auto-generated based on the flow information. Each Node implementation is equipped to work with the VarStore, especially while passing appropriate values to the implementation that was created during the Development step, and while taking the output values from the implementation and updating them to the VarStore. Depending on the node type, this changes.

Figure 16:
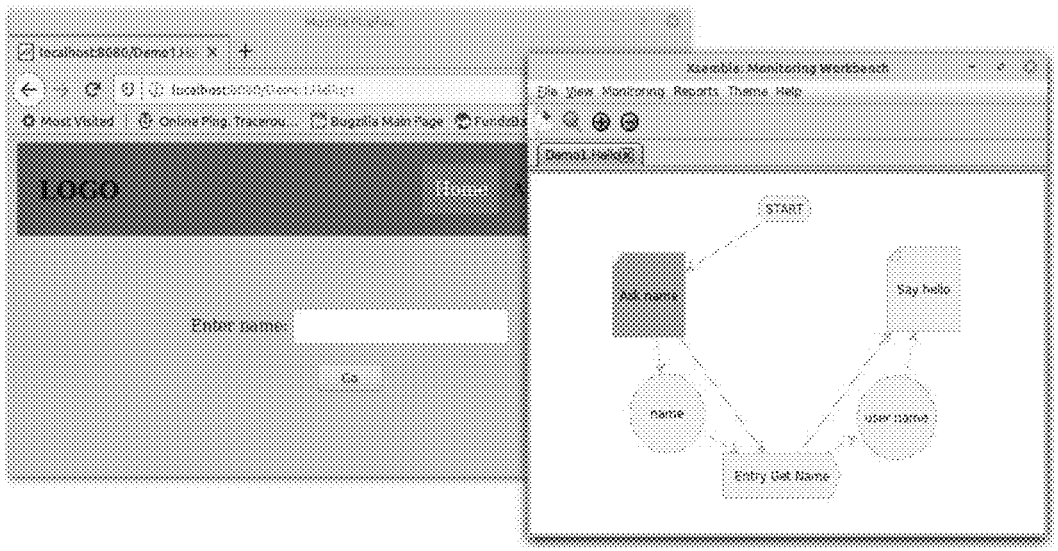
FIG. 16 shows a browser where an application is running and the node colors get changed based on which node is being executed in the monitoring workbench, in accordance with the present invention.

Following table gives the functionality of the Method Instance Node implementation as the Workflow calls them (refer to FIG. 16).

| Method Instance Node | |
|---|---|
| populateInVariables | Based on the data node connected with the in arguments of the given method instance node, retrieves the variable values from the VarStore and populates the "in" map where the values are stored against the arguments of the method instance node. |
| Execute | The method instance has a method component as its base component. In this step, it invokes the implementation of this component as was created in the Development step. Note that the method signature of the base component was auto-generated as the code template, which is now invoked from the Node implementation. The in variable map which was created in the populateInVariables invocation is passed to it, and the output map is returned from the invocation. It contains the exit path and the values corresponding to the out arguments. |
| updateVarStore | The values of the variables are retrieved from the output map, and depending on the mapping between the out arguments and the data nodes or members of data group nodes, the values corresponding to the later are populated in the VarStore. |
| nextNode | Depending on the exit path, returns the instance of the Node implementation corresponding to the node which is connected to the exit path. |

Following illustration is for a method instance node "Modify name" with salient information as follows:
- Node name: Modify name
- Node type: Method instance
- Instance of Method: Add salutation
- Implementing Java class: Demo1.Hello_repo.oprn.Add_salutation
- Input mapping: Data node "user name" mapped to in argument "name"
- Output mapping: Data node "modified name" mapped to out argument "mod name"
- Exit path mapping: Node "Say hello" mapped to exit path "next"

The following listing shows the generated Node implementation corresponding to this method instance (omitting import statements).

```
public class Node_Modify_name implements Workflow.Node {
    private Demo1.Hello_repo.oprn.Add_salutation impl;
    @Override
    public String getId( ) {
        return "Modify name";
    }
    @Override
    public String toString( ) {
        return "Modify name";
    }
    @Override
    public int getType( ) {
        return 1;
    }
    @Override
    public Map<String, Object> populateInVariables(VarStore varStore,
        HttpServletRequest request, String sessionId) {
        Map<String,Object> invars = new HashMap<String,Object>( );
        invars.put("name", varStore.getReqVarValue("", "user name"));
        invars.put("session", sessionId);
        invars.put("meth", "#Modify name");
        return invars;
    }
    @Override
    public Map<String, Object> execute(Map<String, Object> inVars,
        final Workflow.RuntimeContext runtimeContext,
        String sessionId) {
        Map<String,Object> mOutput = new
            Demo1.Hello_repo.oprn.Add_salutation( ).run(inVars);
        return mOutput;
    }
    @Override
    public String updateVarStore(Map<String, Object> outVars, VarStore
        varStore, String sessionId) {
        varStore.getVarReq("").put("mod name", varStore.new
            ValRecord(outVars.get("modified name"),"Modify name"));
        return (String)outVars.get("_exitPath");
    }
    @Override
    public Node nextNode(String exitPath, String sessionId) {
        if (exitPath.equals("next"))
            return new xsemble.controller.n.Node_Say_hello( );
        throw new UnsupportedOperationException("Node \"#Modify name\" does not support exit path " + exitPath);
    }
}
```

Note that this code is simple, with the variables, argument names and node names hardcoded into it. This hardcoding is achieved by the code generation logic, which uses the flow information at the time of burning. This simplicity means that there are not memory intensive runtime lookups at runtime, and therefore the present invention adds little overhead of runtime processing, unlike some other development frameworks that use modularity.

Having seen the Node implementation functionality corresponding to a method instance node in detail, the implementation functionalities corresponding to the other types of nodes are shown below in the following table.

| | Page Instance Node |
|---|---|
| populateInVariables | Similar to the method node instance. |
| Execute | The page instance has a page component as its base component. In execute method, the page is invoked. In an embodiment using Java JEE technology and a JSP page technology, it would get a RequestDispatcher object from the ServletContext object and call the forward method to invoke the JSP page. The in variable map which was created in the populateInVariables invokation is passed to it as a request attribute. |
| updateVarStore | Unsupported for page instance. Never invoked. |
| nextNode | Unsupported for page instance. Never invoked. |
| | Entry Point Instance Node |
| populateInVariables | Similar to the method instance node, however the variable values would be taken not just from VarStore but also from the http request object. |
| Execute | Similar to the method instance node. |
| updateVarStore | Similar to the method instance node. |
| nextNode | Similar to the method instance node. |
| | Subproject Node |
| populateInVariables | Similar to the method instance node. Especially note that the values that are retrieved from VarStore are the ones against the in variables of the subproject node as they appear in the parent project. |
| Execute | Returns the in variables as out variables. No processing done. |
| updateVarStore | Updates the VarStore with values, now against the data nodes corresponding within the child project, which are connected to the start node as the output. |

-continued

| | |
|---|---|
| nextNode | The next node instance that is returned is the node that is the successor of the start node in the child project.<br>Finish Node |
| populateInVariables | Similar to the method instance node. Note that the values come from the variables in the child project within which the finish node resides. |
| Execute | Same as subject node. |
| updateVarStore | Updates the VarStore with values, against the data nodes corresponding in the parent project, which are connected as the outputs to the subproject node that corresponds to the child project. |
| nextNode | The next node instance that is returned is the node that is the successor of the subproject node in the parent project. The successor chosen corresponds to the finish node reached in the child project. |

Node implementation classes are not generated for the menu nodes, data nodes and start nodes. So far, the above description has covered how the Workflow uses the Node implementation classes, which work with the VarStore and the component implementations created at the Development stage. Now it is described how the Workflow gets instantiated and invoked. In an embodiment using Java JEE technology Java servlets are used as the point of entry corresponding to the start node of the top level project. The following listing shows the implementation of such a servlet.

```
@WebServlet(urlPatterns="/x", name="Entry_Main" )
public class Entry_Main extends HttpServlet {
private Workflow.RuntimeContext runtimeContext = null;
private static final Logger log =
LoggerFactory.getLogger(Entry_Main.class);
@Override
public void service(HttpServletRequest request,
HttpServletResponse response) {
runtimeContext = new Workflow.RuntimeContext( );
runtimeContext.servletContext = this.getServletContext( );
runtimeContext.request = request;
runtimeContext.sessionId = request.getSession( ).getId( );
runtimeContext.requestId = UUID.randomUUID( ).toString( );
runtimeContext.response = response;
new Workflow(runtimeContext).executeWorkflow(new
xsemble.controller.n.Node_Ask_name( ));
}
}
```

The main point to observe is that this servlet is mapped to a url pattern "/x". Another file index.html (which gets loaded by default as per web technology) redirects to this url.

```
<html><head>
<meta http-equiv="refresh" content="0; URL=x">
</head></html>
```

Thus, in this specific embodiment, index.html which gets loaded automatically when the application loads on its base url, then redirects the browser to the url /x, which is addressed by the servlet that is mapped to it, and it creates a Workflow instance by passing relevant context information to it (in a variable called runtimeContext) and then calls the executeWorkflow( ) method of the Workflow passing it the first node (the one that is successor to the start node), so that the workflow processing logic starts.

In a specific embodiment where an entry point is mapped with a URL, the burn process also generates special helper code which provides mapping between the exit paths of the node which is a predecessor of an entry point and the URL of that entry point. The intent behind this is to query the helper method to get the url instead of hardcoding that url in a page or menu node corresponding to the exit path (which would create component dependency). Specific examples of such calls can be seen in the generated code templates of a page or a menu such as:

```
<%=xsemble.controller.PageHelper.getPageActionUrl(pageid,exitPath,
request)%>
or
<%=xsemble.controller.MenuHelper.getMenuActionUrl("[Demo2.
Application] Mainmenu","next page", request)%>
```

These links in the pages or menus when clicked by the user, correspond to a server call corresponding to such url. However, this url corresponds to an entry point. There is a generated servlet corresponding to each such entry point which upon invocation, would initialize the Workflow object and begin the workflow, passing the entry point node as the begin node. The listing below shows such a generated servlet:

```
@WebServlet(urlPatterns="/x/hello", name="Entry_x_hello" )
public class Entry_x_hello extends HttpServlet {
private Workflow.RuntimeContext runtimeContext = null;
private static final Logger log =
LoggerFactory.getLogger(Entry_x_hello.class);
@Override
public void service(HttpServletRequest request,
HttpServletResponse response) {
runtimeContext = new Workflow.RuntimeContext( );
runtimeContext.servletContext = this.getServletContext( );
runtimeContext.request = request;
runtimeContext.sessionId = request.getSession( ).getId( );
runtimeContext.requestId = UUID.randomUUID( ).toString( );
runtimeContext.response = response;
new Workflow(runtimeContext).executeWorkflow(new
xsemble.controller.n.Node_Entry_Get_Name( ));
}
}
```

The code generated for app startup entry points is slightly different. Their onAppStartup( ) method is invoked when the layer starts. In case of Java JEE technology, an embodiment creates a ServletContextListener so that its contextInitialized( ) method is invoked when the JEE web container starts, then a thread is spawned and the onAppStartup( ) method is invoked in that thread. In a similar fashion, the contextDestroyed( ) method callback from ServletContextListener is used to call onAppShutdown( ) on the app startup entry point. As seen earlier, it is the responsibility of the programmer to invoke the workflow upon the appropriate invocation and passing the entry point instance to this Workflow object.

This is the way the generated glue code works, and keeps executing the nodes as per the design, invoking their implementations as needed.

The application (50) generated using the system (100) and the method creates log during its run time using a technology-specific logging mechanism. For these logs to be very useful to locate the source of the problem they include the node name, session id and a unique id of the request in an embodiment. Even in the absence of technologies that naturally support sessions, the burning logic tries to generate a reasonable session id. For instance, in terms of a Web-Socket connection, a unique session id is auto-generated on the server side when the websocket connection gets opened, and that is passed to the handling logic every time there is data incoming.

In an embodiment, there is a provision to copy files from an "override" folder towards the end of the burn process, before the build. This provides a manual override over the generated files, in the rare cases that it is needed.

Unit Testing and the Development Alternative Using Test Bundles

The system (100) and method allows test bundle generation and import during the development stage. Specifically, unit testing of components is mandated in the approach using test bundles; but it would be done even without going for the test bundle approach.

The way developer's workbench (40) helps by generating code templates for component implementation, it also generates test templates for unit testing the component. These templates are based on the unit testing frameworks corresponding to the platform's technology. Thus, in a Java environment, a unit testing technology such as JUnit and its associated technologies (such as mockito) would be used in the generated test templates, whereas in case of PHP, a unit testing technology such as PHPUnit could be used. The below listing shows a test template generated for a method component:

```
package Demo1.Hello_repo.oprn;
import java.util.HashMap;
import java.util.Map;
import org.junit.After;
import org.junit.Before;
import org.junit.Test;
import Demo1.Hello_repo.oprn.Add_salutation;
import static org.junit.Assert.*;
/**
*Test cases for method [Demo1.Hello repo] Add salutation
*/
public class Add_salutation_test {
@Before
public void setUp( ) throws Exception {
}
@After
public void tearDown( ) throws Exception {
}
/*
// This is default implementation of a test. Copy it outside the comment and fill it for each test case.
// Do not forget to add appropriate Javadoc comment describing what a test is for.
@Test
public void test( ) {
Map<String,Object> inargs = new HashMap<String,Object>( );
// TODO: Initialize inargs
// Feel free to mock objects using Mockito as needed for the unit test
// Call method
Add_salutation method = new Add_salutation( );
Map<String,Object> outargs = method.run(inargs);
// TODO: Test outargs
}
*/
}
```

Observe that there is a commented test method which can be copy-pasted and modified appropriately by a programmer to create the unit test cases. Also observe that the method call is already generated and helpful comments are provided in the generated test template code. Testing the entry points is similar, with the http request/response objects mocked. The corresponding generated test template is given below

```
package Demo1.Hello_repo.ent;
import static org.junit.Assert.*;
import static org.mockito.Mockito.*;
import java.util.HashMap;
import java.util.Map;
import javax.servlet.http.HttpServletRequest;
import javax.servlet.http.HttpServletResponse;
import org.junit.After;
import org.junit.Before;
import org.junit.Test;
/**
* Test cases for entry point [Demo1.Hello repo] Name Getter
*/
public class Name_Getter_entry_test {
@Before
public void setUp( ) throws Exception {
}
@After
public void tearDown( ) throws Exception {
}
/*
// This is default implementation of a test. Copy it outside the comment and fill it for each test case.
// Do not forget to add appropriate Javadoc comment describing what the test is for.
@Test
public void test( ) {
// Mock request and response using mockito
HttpServletRequest request = mock(HttpServletRequest.class);
HttpServletResponse response = mock(HttpServletResponse.class);
// Give them operations that would succeed, like below
//when(request.getParameter("a")).thenReturn("b");
Map<String,Object> mInput = new HashMap<String,Object>( );
// Add parameters to mInputs as needed
//mInput.put("a", "b");
// Last two parameters are sessionid and id of the entry point instance. Initialize them any way
Map<String,Object> mOutput = new Name_Getter_entry( ).onEntryBegin(request, response, mInput, "ABCD", "XYZ123");
// Do your testing on what you expect to see in mOutput
// Could be either "_exitPath" or another entry in the map.
fail("Not yet implemented");
}
*/
}
```

With respect to the pages in a web application, a good unit testing can be achieved only by deploying the pages on the web server and then connecting to the web server from a test case. To make this possible, supporting code is generated while creating the test bundle. The listing below shows a test template generated for a page component.

```
package Demo1.Hello_repo.pg;
import java.util.HashMap;
```

-continued

```
import java.util.Map;
import org.junit.After;
import org.junit.Before;
import org.junit.Test;
import static org.junit.Assert.*;
import com.meterware.httpunit.PostMethodWebRequest;
import com.meterware.httpunit.WebConversation;
import com.meterware.httpunit.WebRequest;
import com.meterware.httpunit.WebResponse;
import xsemble.util.PageUtil;
/**
*Test cases for page [Demo1.Hello repo] Show Name
*/
public class Show_Name_test {
@Before
public void setUp( ) throws Exception {
}
@After
public void tearDown( ) throws Exception {
}
/*
// This is default implementation of a test. Copy it outside the
comment and fill it for each test case.
// Do not forget to add appropriate Javadoc comment describing
what the test is for.
@Test
public void test( ) {
Map<String,Object> invars = new HashMap<String,Object>( );
invars.put("pg", "XYZ"); // Whatever instance id that you want the
page to report
invars.put("session", "ABCD"); // Whatever session id that you
want the page to have
// Feel free to add any other invars that get into the page
String xmlStr = PageUtil.getXml(invars);
System.out.println(xmlStr); // Writing to console so that it can
be copy-pasted from there and run from the index page
// Use HttpUnit http://httpunit.sourceforge.net/doc/cookbook.html
to create WebRequest to call the CallerServlet
WebConversation wc = new WebConversation( );
WebRequest req = new
PostMethodWebRequest(PageUtil.getTestSystemBaseUrl( ) +
"/x/pagecaller");
req.setParameter("component", "[Demo1.Hello repo] Show Name");
req.setParameter("invars", xmlStr);
try {
WebResponse resp = wc.getResponse(req); // Response of this
request, the desired page
// Test what you want now - for example:
// - the text (or even title) generated on the response page from
the resp object
// - the info on the response that you get after clicking a link
or after submitting a form (the response page is typically the
jspinfo page)
assertTrue(resp.getTitle( ).equals(""));
}
catch (Exception exc) {
fail("Exception encountered " + exc.getMessage( ));
exc.printStackTrace( );
}
}
*/
}
```

In the test bundle approach, on user's input, a test bundle corresponding to selected executable functions is exported out of the repository (20) using the developers' workbench (40). The unit testing code stubs are auto-generated (if the unit testing code is not already present), and any libraries that may be needed are included. In addition, other auto-generated supporting code is generated, so that the test bundle itself may be executed to run these unit tests. Editor friendly files may also be generated so that the test bundle may be opened in an editor for easier editing. With these, a test bundle may be opened as a standard project, and the execution of functions included in the test bundle happens through running the unit tests. Unit testing is thus mandated when programmer users work with the test bundles.

The component implementation code that goes in the test bundles could be the finished implementations, or they could even be just the code templates automatically generated. This enables one to use test bundle approach not just for testing but also for implementation. Specifically, best practices such as Test Driven Development can be used effectively using the test bundle approach.

The listing below shows a servlet that is generated as a part of the supporting code. It gets invoked on url /x/pagecaller, takes parameters component and invars corresponding to the name of the page to be invoked and the encoded values of in variables respectively, and then invokes the particular page while passing the values received. This servlet gets invoked from the unit test case of a page, passing the expected parameters.

```
@WebServlet(displayName="call a page",urlPatterns="/x/pagecaller")
public class CallerServlet extends HttpServlet {
private Logger logger = LoggerFactory.getLogger(this.getClass( ));
private Map<String,String> pageImplMap;
@Override
public void init( ) {
pageImplMap = new HashMap<String,String>( );
pageImplMap.put("[Demo1.Hello repo] Show Name",
"Demo1/Hello_repo/Show_Name.jsp");
}
@Override
public void service(HttpServletRequest request,
HttpServletResponse response) throws ServletException, IOException
{
String componentId = request.getParameter("component");
String invarsXml = request.getParameter("invars");
if (componentId == null)
throw new RuntimeException("Mandatory request parameter
'component' missing");
if (invarsXml != null) {
XMLDecoder xd = new XMLDecoder(new
ByteArrayInputStream(invarsXml.getBytes(StandardCharset-
s.UTF_8)));
@SuppressWarnings("unchecked")
Map<String, Object> inVars = (Map<String, Object>)
xd.readObject( );
xd.close( );
request.setAttribute("Page Input", inVars);
}
String impl = pageImplMap.get(componentId);
getServletContext( ).getRequestDispatcher("/" +
impl).forward(request, response);
}
}
```

The test bundle also has dummy implementations of page helper and menu helper classes so that the calls from the page or menu are honored. These calls are directed to a special url where a generated page listens. This listener page simply lists down all information that it receives from the call, including any http parameters (similar to the phpinfo( ) implementation in a PHP server). A unit test for the page can then request the page to submit and then check the values returned to the listener page. As far as the unit testing of the method and entry point components is concerned, it is relatively straightforward, and happens within the test bundle process.

User Accesses:

An embodiment may apply authentication and authorization to the users. They could be applied either at the functionality level or at the component level or both. Thus, in an embodiment, a given user may have access to the functionality of editing the component implementations (functionality level access), and that can be further granularized by specifying the components to which this access is allowed or disallowed (component level access). How the system knows which user is logged in is left to the specific Authentication and Authorization technology of the system. In an embodiment, this information may be embedded in an encrypted license file.

Run Time Monitoring:

The method supports run time monitoring in two ways:

By connecting to a live application

By feeding logs collected from a live application

In the embodiment, a separate tool named Monitoring Workbench which is used for the monitoring.

Monitoring a Live Application:

The visual monitoring of a live application is highly useful for one to understand the actual flow. It is similar to the source code debugging facility available with most programming IDEs, but the differences are that this debugging happens at the modular level and it is visual. Being visual, it can be done even by non programmers to accurately understand how the program execution proceeds.

Figure 17:
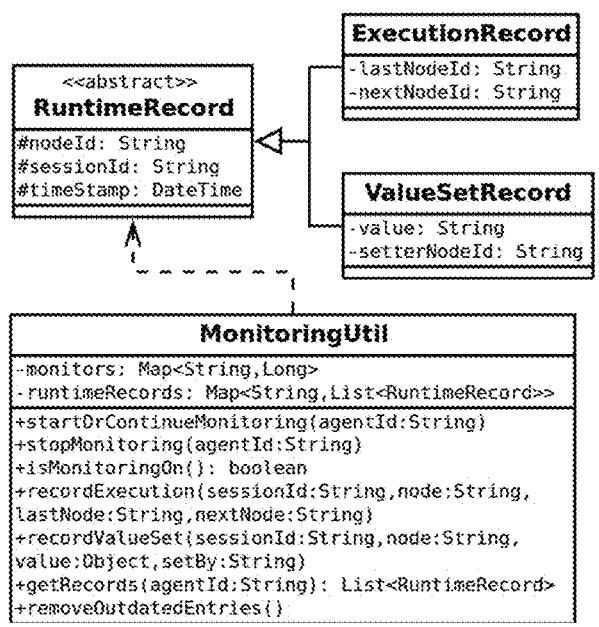
FIG. 17 shows the class diagram of the important monitoring classes that appear in the generated glue code, in accordance with the present invention.

FIG. 17 shows a browser where an application is running and the monitoring workbench where the node colors keep getting changed based on which node is being executed. It is also possible to find the run history for an execution node as well as the history of how the values were set in case of a data node. It is also possible to get consolidated history of the complete execution during the time that the application is monitored. In other embodiments, many sophisticated reports about the application run may be generated out of the monitoring.

For monitoring a live application, the application needs to be burnt with the debug mode on. This injects extra functionality in the generated glue code which allows collection of data at runtime. Also, new connection point is provided so that the collected data can be fetched by the monitoring workbench. In an embodiment on a Java JEE server, such connectivity may be provided by a servlet.

FIG. 18 shows the class diagram of the important monitoring classes that appear in the generated glue code in an embodiment when it is generated with the debug more on. As can be seen a RuntimeRecord may be an execution record or a value set record (meaning some node setting a value into a data node or a member of a data group node). The recordExecution( ) and recordValueSet( ) methods are called by the code during execution to set up the values. The MonitoringUtil also needs to keep track of remote monitoring agents (one or more monitoring workbench systems connected), and those agents will call the startOrContinueMonitoring( ) stopMonitoring( ) or getRecords( ) methods via a servlet (not shown). The monitoring is on as long as at least one agent is actively monitoring. Otherwise it is off. The recording is not done when monitoring is off. The getRecords( ) delivers incremental records to the agents, starting from the time the agents connect.

Further, we can have breakpoints in an embodiment. In another embodiment, the breakpoints can be conditional on the value of some variable or the execution of some execution node. This is particularly useful when a node runs multiple times (possibly in a loop) and we are interested only in cases where a particular variable reaches certain value. In an embodiment having class structure design similar to FIG. 18, this is implemented by enhancing the MonitoringUtil further to store the breakpoints of the node and the Workflow consulting it at the time of node execution, breaking when a breakpoint is reached.

Monitoring an Application Based on Logs:

Similar visual monitoring can be done when the logs of the application are fed to the monitoring workbench. For this, detailed logging is enabled in the application at the time of burning, so that the deployed application has generated code to that logs the information needed for the monitoring. In an embodiment, the fields of the Execution records and Value set records as per FIG. 18 are needed to be stored in the log, so that they can be parsed from the log file, and the application run is reconstructed from those. This facility primarily helps the support teams who need to troubleshoot an issue that happened at the client's end. They could now ask for the log, feed it to the monitoring workbench and see what exactly happened.

Development Effort Estimation:

The present invention allows a crisper and detailed development effort estimation once the design is done. This estimation is done at component level. Doing the effort estimation at the component level is much more detailed than doing it at the user story level or high level requirements level as is done conventionally. After the design step, the knowledge of which components are required in the program, and out of those which are already available in terms of an implementation that is compatible with the chosen architecture layer technology. This knowledge, coupled with the component estimates, can give rise to much crisper and highly dependable effort estimates. Given that one could have the functionality organized across multiple projects or multiple repositories, the estimates sliced into such projects/repositories also give an indication of the relative sizing of these various functionalities.

Finally, because these estimates can be derived effortlessly once the component sizing is done, different what-if scenarios may be evaluated with respect to the development effort prior to the development. Examples of such questions include "What is the impact of excluding or including certain feature?" or "How would the estimate change if the platform technology is changed from one version to another?" This results in a more informed decision making.

Development Progress Tracking:

Like the effort estimation, progress tracking also gets benefited by the modularity. The entire development effort is that of developing the components, and the glue code is auto-generated. The definition of "done" can be highly crisp for a component, as opposed to a user story or a requirement. Since the components to be implemented are known beforehand, it becomes easy to see the real project progress in terms of component development.

Advantages of the Invention:

1. The functions as defined in this invention are independent of one another and hence may be developed completely independently of one another.

2. More efficient utilization of programming resources is possible because of the independence of the functions. Complex functions may be assigned to skilled programmers whereas functions with lower complexity may be assigned to lower-skilled programmers. It is also possible to outsource the functions to external freelancers, especially by exporting as test bundles.

3. The system (100) allows grouping of components within repositories and projects, where repositories can depend on other repositories, projects can depend on repositories and projects can refer to other projects using the subproject nodes. Because of these interdependent grouping possibilities, complex functionality may be broken down into sets of repositories and projects, and remain simple enough for human understanding.

4. Code generation in the present invention reduces development effort and brings accuracy, so that the application is less error-prone.

5. The test bundle approach really dissects a complex program into hundreds of mini programs (corresponding to a component each). Each of these mini programs is order of magnitude easy to develop and unit test, which increases the quality of the individual components and hence of the overall application.

6. The individual components being small, they can be maintained with relative ease. This means that inefficiencies such as unnecessary variables and control structure can be kept out. Apart from the components, the glue code is auto-generated each time, and is optimal for the implementation, containing no redundant code and hoops. This avoids inefficiencies and can utilize the memory and processor's processing power optimally 7. The system (100) and method ensure that the application generated is always completely modular. With this, the possibility of making changes in one place and that could break something in another place goes away. In effect, the quality improves further.

8. During the burn process, the implementations and dependencies of only those components which take part in the project/flow are used, thereby eliminating unreachable code and unused dependencies getting included in the deployed application, in effect saving the memory and disk space.

9. Method allows flow editing to be done independent from the individual component implementations and non programmatically. The Design and Burn steps in the method are non programmatic, and the programmers need to be engaged in the Development stage only. This lets the non programming stakeholders such as domain experts or managers to own the application and go to the developers only for development of individual components. This means a more effective use of the non-programming manpower.

10. As long as the method is followed, the flow diagram in the flow/project (30) is always up to date with the application, and serves as the live documentation of the functioning of software. This is knowledge generation.

11. Because the development is done one component at a time, the learning curve for a programmer to be productive drops drastically. The programmers need to understand the functionality of only the component at hand. This reduces the need for them to acquire in-depth domain knowledge, and reduces the risk arising out of them not being adept at it. New programmers can be productive in a short time, and this leads to a more effective use of the programming manpower.

12. The runtime monitoring makes troubleshooting very easy. Since one may visually see the flow being executed and the various inputs and outputs of the components, a problem may be isolated to a component even before involving a programmer. The programmer can then perform surgical fix on the defective component and the rest of the system continues performing unaltered. This is especially attractive during the long maintenance phase of a project.

13. The system (100) and method support applications which may be based upon different languages/frameworks, as long as the plugin supporting that language/framework is available.

14. The reusability of components is high. The components may be used simply by adding a dependency on the repository that contains them. The technology compatibility is evaluated with the architectural layer that the component would be used. Thus, a server side Java method may be reused in an Android application as long as the versions are compatible.

15. The development effort estimate being done in terms of components is more accurate and amenable to what-if analysis. This enables better budgeting and taking informed decisions. Progress tracking becomes more accurate and crisp, when done at component level.

16. The invention makes the building blocks of software explicit and hence amenable to further sophisticated analysis, thus creating knowledge. The system allows explicit definition of technologies supported at the platform, and technologies supported at the component level. This leads to automatic assessment on technology compatibility between the various components that could go in the deployable and the platform, even before the deployable is made. This is knowledge generation.

17. The invention also allows the glue code to be generated in such a way that it makes efficient use of the processor resources by distributing the component executions across multiple cores or multiple hardware instances, depending on the technology capabilities of the corresponding architectural layer.

18. The present invention increases maintainability by providing help to quickly zero in on the component causing problem and fixing only that component, leaving the rest of the application intact.

19. The present invention provides the information about the software building blocks explicitly defined so that the information is amenable to be treated with sophisticated techniques such as graph analysis, simulation, data processing and visualization.

20. The present invention makes it possible to implement type safety at the component/node level even when the implementation languages that are inherently not type safe.

21. The present invention enables in shifting the design decisions from programmers to non-programmers, which also makes it possible to reuse the same components in different contexts. One example of this would be the instances of the same entry point instances be available under different URLs.

22. The present invention enables the support teams to monitor the status of the application from the logs.

The foregoing objects of the invention are accomplished and the problems and shortcomings associated with prior art techniques and approaches are overcome by the present invention described in the present embodiment. Detailed descriptions of the preferred embodiment are provided herein; however, it is to be understood that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, or matter. The embodiments of the invention as described above and the methods disclosed herein will suggest further modification and alterations to those skilled in the art. Such further modifications and alterations may be made without departing from the scope of the invention.

I claim:

1. A computer implemented system for creating one or more deployable applications and a source code thereof using reusable components, the system comprising:
   an input and output unit;
   a memory unit capable of storing a plurality of processing instructions and data, wherein the memory unit comprises:

one or more repositories having reusable components, wherein the reusable components are data types and executable functions, one or more flow/projects as directed graphs consisting of node connectivity information comprising control flow and data flow, a developer's workbench capable of receiving input from a user to create definitions of the reusable components, wherein the definitions of executable functions comprise of in arguments, out arguments, and exit paths, wherein the in arguments, the out arguments, and the exit paths are defined mutually exclusive from each other, wherein the in arguments are data ports for receiving data and the out argument are data ports for sending data out, and the exit paths are the outgoing control flow ports, and generating code templates using the definitions of the reusable components, wherein the code templates facilitate the user to add required implementation code and associated dependencies to create implementation of the reusable components as required, an assembler's workbench capable of providing work environment to create the flow/project using project nodes comprising of instances of the reusable components and other nodes and the connectivity information provided by the user using the data ports and the control flow ports, wherein data flow and control flow between project nodes are mutually exclusive, wherein the project nodes comprise a set of data nodes and a set of execution nodes, wherein the control flow comprises one or more control links, wherein each control link is established only between two execution nodes, from the set of execution nodes, and wherein the data flow comprises one or more data links, wherein each data link is established only between a data node, from the set of data nodes, and an execution node, from the set of execution nodes, and burning that includes processing the flow/project, the definitions and implementations of the reusable components to generate source code of the deployable applications;

a processor unit capable of communicating with the memory unit to issue the plurality of processing instructions stored in the memory unit, wherein the processor unit executes the developer's workbench and the assembler's workbench; and a storage unit capable of communicating with the processor unit for storing the deployable applications therein.

2. The system as claimed in claim 1, wherein the memory unit further comprises a monitoring workbench capable of connecting to the deployed applications and fetching and displaying run time information for visual debugging, and processing a detailed log file generated from the deployed applications to help the user understand visually the actual runtime flow in the deployed applications, wherein the processor unit is enabled to execute the monitoring workbench in the memory unit and the user is enabled to interact with the monitoring workbench using the input and output unit.

3. The system as claimed in claim 1, wherein the control flow is imperative or a combination of imperative and declarative.

4. The system as claimed in claim 1, wherein the developer's workbench generates and exports test bundles corresponding to the selected functions, wherein unit testing code stubs are auto-generated.

5. The system as claimed in claim 1, wherein the reusable components correspond to technology, defined as a combination of technology name and version, the flow/project corresponds to one or more architectural layers, wherein each of these architectural layers corresponds to a given platform with platform specific technologies and the project nodes correspond to the one or more architectural layers present in the project/flow, wherein the system assesses technological compatibility of the project nodes with respect to the platform and enables/disables the node connectivity.

6. The system as claimed in claim 1, wherein the assembler's workbench does type checking at node connection level, even when the underlying programming language does not support static typing.

7. The system as claimed in claim 1, wherein the executable functions comprise methods that are isolated execution blocks of business logic and correspond to the methods, functions or subroutines as defined in various programming languages, pages facilitating the user interaction, interaction with external system or data passed to another layer, and entry points facilitating control flow between two architectural layers.

8. The system as claimed in claim 1, wherein the type of the components and the nodes is identified based upon the unique shape of the respective components within the repository and the nodes in the flow diagram associated with the flow/project.

9. The system as claimed in claim 1, wherein the underlying component definitions refer only to the port names defined within the component, without using any information outside the component, thereby facilitating the components to be reusable.

10. The system as claimed in claim 1, wherein a flow/project may include any number of subproject nodes, each subproject node representing another flow/project, wherein the flow/project containing the subproject node is said to be a parent of the flow/project represented by the subproject node, wherein the exit paths of the subproject nodes correspond to the names of the finish nodes in the child project, the in arguments of the subproject node correspond to the out arguments from the start node within the child project and the out arguments of the subproject node correspond to the in arguments of the finish nodes within the child project, wherein parent, children, their children thereof establish a hierarchy of the parent/child projects in form of a project tree.

11. The system as claimed in claim 1, wherein the user is provided either a functionality level access or a component level access or both, wherein the functionality level access defines whether the user has access to certain functionality, and the component level access further defines fine grained access to these functionalities at component level.

12. A method for creating one or more deployable applications and a source code thereof using the flow/project and the reusable components comprising steps of:

receiving, via a processor, input from a user comprising in arguments, out arguments and exit paths to create definitions of the reusable components by a developer's workbench, wherein the definitions of executable functions comprise of in arguments, out arguments, and exit paths, wherein the in arguments, the out arguments, and the exit paths are defined mutually exclusive from each other, wherein the in arguments are data ports for receiving data and the out argument are data ports for sending data out, and the exit paths are the outgoing control flow ports;

generating, via the processor, code templates using the definition of the reusable components by the developer's workbench, wherein the code templates facilitate the user to add required implementation code and associated dependencies to create implementation of the reusable components;

providing, via the processor, work environment to create the flow/project by an assembler's workbench, using project nodes comprising of instances of the reusable components and other nodes and the connectivity information provided by the user using the data ports and the control flow ports, wherein data flow and control flow between project nodes are mutually exclusive, wherein the project nodes comprise a set of data nodes and a set of execution nodes, wherein the control flow comprises one or more control links, wherein each control link is established only between two execution nodes, from the set of execution nodes, and wherein the data flow comprises one or more data links, wherein each data link is established only between a data node, from the set of data nodes, and an execution node, from the set of execution nodes; and burning, via a processor, that includes processing the flow/project, the definitions and implementations of the reusable components by the assembler's workbench to generate source code of the deployable applications.

13. The method as claimed in claim 12 further comprising monitoring of the deployable applications using a monitoring workbench by, connecting to the deployed applications and fetching and displaying run time information for visual debugging as the application runs, or processing a detailed log file generated from the deployed applications to help the user understand visually the actual runtime flow in the deployed applications.

14. The method as claimed in claim 12, wherein glue code in the burnt application acts as a main controller that schedules the nodes for execution and enabling optimizations such as multi-threading based on the flow definition, thereby efficiently utilizing processor cycles.

15. The method as claimed in claim 12 further comprising test bundle generation from reusable component implementations by test code stub generation and code generation of supporting files such that the test bundle becomes a stand-alone deployable application.

16. The method as claimed in the claim 12, wherein the source code of the deployable applications, generated based upon the burning, consists of the component implementation code and generated glue code which invokes these components, and wherein in the burning step, the dependencies that correspond to the components in use are picked and get added to the final deployable, thereby preventing code bloat and reducing memory and disk space requirements.

17. The method as claimed in the claim 12, wherein the generated code has programming constructs for logging, error handling and security and the like.

18. The method as claimed in claim 12, wherein the source of the deployable application is generated such that, during execution, when a subproject node is encountered in a flow/project, the execution would go into the child flow/project corresponding to the subproject node, starting from the start node and continuing till a finish node is encountered, and thereafter resuming in the parent project beyond the subproject node.

19. A non-transitory computer readable medium storing program for creating one or more deployable applications and a source code thereof using reusable components, the program comprising programmed instructions for:

receiving input from a user comprising in arguments, out arguments and exit paths to create definitions of the reusable components by a developer's workbench, wherein the definitions of executable functions comprise of in arguments, out arguments, and exit paths, wherein the in arguments, the out arguments, and the exit paths are defined mutually exclusive from each other, wherein the in arguments are data ports for receiving data and the out argument are data ports for sending data out, and the exit paths are the outgoing control flow ports;

generating code templates using the definition of the reusable components by the developer's workbench, wherein the code templates facilitate the user to add required implementation code and associated dependencies to create implementation of the reusable components;

providing work environment to create the flow/project by an assembler's workbench, using project nodes comprising of instances of the reusable components and other nodes and the connectivity information provided by the user using the data ports and the control flow ports, wherein data flow and control flow between project nodes are mutually exclusive, wherein the project nodes comprise a set of data nodes and a set of execution nodes, wherein the control flow comprises one or more control links, wherein each control link is established only between two execution nodes, from the set of execution nodes, and wherein the data flow comprises one or more data links, wherein each data link is established only between a data node, from the set of data nodes, and an execution node, from the set of execution nodes; and burning that includes processing the flow/project, the definitions and implementations of the reusable components by the assembler's workbench to generate source code of the deployable applications.

\* \* \* \* \*